United States Patent
Niwa et al.

(10) Patent No.: US 12,300,966 B2
(45) Date of Patent: May 13, 2025

(54) SEMICONDUCTOR LASER DEVICE

(71) Applicant: Mitsubishi Electric Corporation, Tokyo (JP)

(72) Inventors: Akitsugu Niwa, Tokyo (JP); Kenichi Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 802 days.

(21) Appl. No.: 17/597,373

(22) PCT Filed: Sep. 17, 2019

(86) PCT No.: PCT/JP2019/036336
§ 371 (c)(1),
(2) Date: Jan. 4, 2022

(87) PCT Pub. No.: WO2021/053711
PCT Pub. Date: Mar. 25, 2021

(65) Prior Publication Data
US 2022/0255290 A1    Aug. 11, 2022

(51) Int. Cl.
*H01S 5/026* (2006.01)
*H01S 5/042* (2006.01)
(Continued)

(52) U.S. Cl.
CPC .......... *H01S 5/0264* (2013.01); *H01S 5/0265* (2013.01); *H01S 5/0427* (2013.01);
(Continued)

(58) Field of Classification Search
CPC .... H01S 5/0264; H01S 5/0265; H01S 5/0427; H01S 5/1014; H01S 5/12; H01S 5/22; H01S 5/04256; H01S 5/1007; H01S 5/026

See application file for complete search history.

(56) References Cited

U.S. PATENT DOCUMENTS 4,815,090 A    3/1989 Usami et al.
9,726,841 B1    8/2017 Lin et al.
(Continued)

FOREIGN PATENT DOCUMENTS

CN    101969079 A    2/2011
CN    103154791 A    6/2013
(Continued)

OTHER PUBLICATIONS

Machine translation of KR-20010028259-A (Year: 2001).*
(Continued)

*Primary Examiner* — Yuanda Zhang
(74) *Attorney, Agent, or Firm* — Studebaker Brackett PLLC

(57) ABSTRACT

The semiconductor laser device comprises a laser part, a waveguide for propagating laser light emitted by the laser part, and a photodetector for detecting the laser light which are formed on the same semiconductor substrate. The photodetector includes a p-type contact layer which is formed above the side of the waveguide on the side opposite to the semiconductor substrate and is connected to an anode electrode, an n-type contact layer connected to a cathode electrode, and an undoped layer formed between the p-type contact layer and the n-type contact layer. The undoped layer and the n-type contact layer in the photodetector include a main light receiving part disposed above the waveguide so as to encompass the waveguide, and an enlarged part disposed so as not to encompass the waveguide while connected to the main light receiving part.

20 Claims, 15 Drawing Sheets

(51) Int. Cl.
  *H01S 5/10* (2021.01)
  *H01S 5/12* (2021.01)
  *H01S 5/22* (2006.01)
  *H10F 55/255* (2025.01)

(52) U.S. Cl.
  CPC .............. *H01S 5/1014* (2013.01); *H01S 5/12* (2013.01); *H01S 5/22* (2013.01); *H10F 55/255* (2025.01); *H01S 2304/04* (2013.01)

(56) References Cited

U.S. PATENT DOCUMENTS

| | | |
|---|---|---|
| 2004/0056250 A1 | 3/2004 | Wang et al. |
| 2010/0301441 A1 | 12/2010 | Pan et al. |
| 2013/0301985 A1 | 11/2013 | Achouche et al. |
| 2020/0274318 A1 | 8/2020 | Matsumoto et al. |

FOREIGN PATENT DOCUMENTS

| | | | | |
|---|---|---|---|---|
| JP | S63-222485 A | 9/1988 | | |
| JP | 2000-036638 A | 2/2000 | | |
| JP | 2004-111763 A | 4/2004 | | |
| JP | 2013-540351 A | 10/2013 | | |
| JP | 2019-008179 A | 1/2019 | | |
| KR | 20010028259 A | * | 4/2001 | ........... G02B 6/4214 |
| WO | 2019/069359 A1 | 4/2019 | | |

OTHER PUBLICATIONS

International Search Report issued in PCT/JP2019/036336; mailed Dec. 10, 2019.

An Office Action; "Notice of Reasons for Refusal," mailed by the Japanese Patent Office on Oct. 11, 2022, which corresponds to Japanese Patent Application No. 2021-546073 and is related to U.S. Appl. No. 17/597,373; with English language translation.

An Office Action mailed by China National Intellectual Property Administration on Feb. 8, 2024, which corresponds to Chinese Patent Application No. 201980100307.X and is related to U.S. Appl. No. 17/597,373; with English language translation.

* cited by examiner

SEMICONDUCTOR LASER DEVICE

TECHNICAL FIELD

The present application relates to a semiconductor laser device.

BACKGROUND ART

Patent Document 1 discloses a distributed feedback semiconductor laser with a monitor which is a distributed feedback semiconductor laser in which a photodiode (monitor photo diode (PD)) having a monitor function is integrated, in order to reduce the number of components of an optical communication device. In the distributed feedback semiconductor laser with a monitor in Patent Document 1, a p-type contact layer for connecting a p-type layer in a p-n junction in a laser region to an anode electrode is extended, and a monitor region is formed on the p-type contact layer so as to separate the p-n junctions of the laser region and the monitor region with each other.

CITATION LIST

Patent Document

Patent Document 1: Japanese Patent Application Laid-open No. S63-222485 (FIG. 4)

SUMMARY OF INVENTION

Problems to be Solved by Invention

In the distributed feedback semiconductor laser with a monitor in Patent Document 1, a method is used in which the p-type contact layer connected to the anode electrode of the laser region and the p-type contact layer connected to an anode electrode of a monitor PD are formed as the same layer, thereby reducing the number of manufacturing steps. In the semiconductor laser having a diode structure, it is desirable that the contact resistance between the anode electrode and the p-type contact layer be small. Therefore, the doping concentration (impurity concentration) of the p-type contact layer is usually set to a high concentration of $1.0 \times 10^{18}$ cm$^{-3}$ or more to reduce the contact resistance.

In the distributed feedback semiconductor laser with a monitor in Patent Document 1, there is no n-type contact layer between the cathode electrode and the n-type layer in the monitor PD serving as a photodetector, but there is a case where an n-type contact layer is interposed between the cathode electrode and the n-type layer of the monitor PD. In the case where an n-type contact layer is interposed between the n-type layer of the monitor PD and the cathode electrode, and the doping concentrations of the n-type contact layer and the p-type contact layer of the monitor PD are high, the thickness of the depletion layer generated in the monitor PD when a voltage is applied to the monitor PD is reduced, and a phenomenon occurs in which the current due to the band-to-band tunneling effect is concentrated in an outer edge of the n-type contact layer. This causes a problem in that an overcurrent flows in the monitor PD in the semiconductor laser device in which the semiconductor laser and the monitor PD are integrated, and the monitor PD is easily damaged. Since the overcurrent is generated in the monitor PD even when electrostatic discharge (hereinafter referred to as ESD) occurs due to external static electricity, there is a problem that the ESD resistance is reduced.

The technique disclosed in the present specification aims to increase an ESD withstand voltage of a photodetector in a semiconductor laser device in which a semiconductor laser and a photodetector are integrated.

Means for Solving Problems

A semiconductor laser device disclosed in the present specification includes a laser part to emit laser light, a waveguide to propagate the laser light emitted from the laser part, and a photodetector to detect the laser light emitted from the laser part which are formed on the same semiconductor substrate. The photodetector includes an anode electrode, a cathode electrode, a p-type contact layer which is formed above the waveguide on a side opposite to the semiconductor substrate and is connected to the anode electrode, an n-type contact layer connected to the cathode electrode, and an undoped layer formed between the p-type contact layer and the n-type contact layer. The undoped layer and the n-type contact layer in the photodetector include a main light receiving part disposed above the waveguide so as to encompass the waveguide, and an enlarged part disposed so as not to encompass the waveguide while connected to the main light receiving part.

Effect of Invention

In the semiconductor laser device disclosed in the present specification, since the photodetector includes the main light receiving part and the enlarged part connected to the main light receiving part, the ESD withstand voltage of the photodetector can be increased.

MODES FOR CARRYING OUT INVENTION

Embodiment 1

Figure 1:
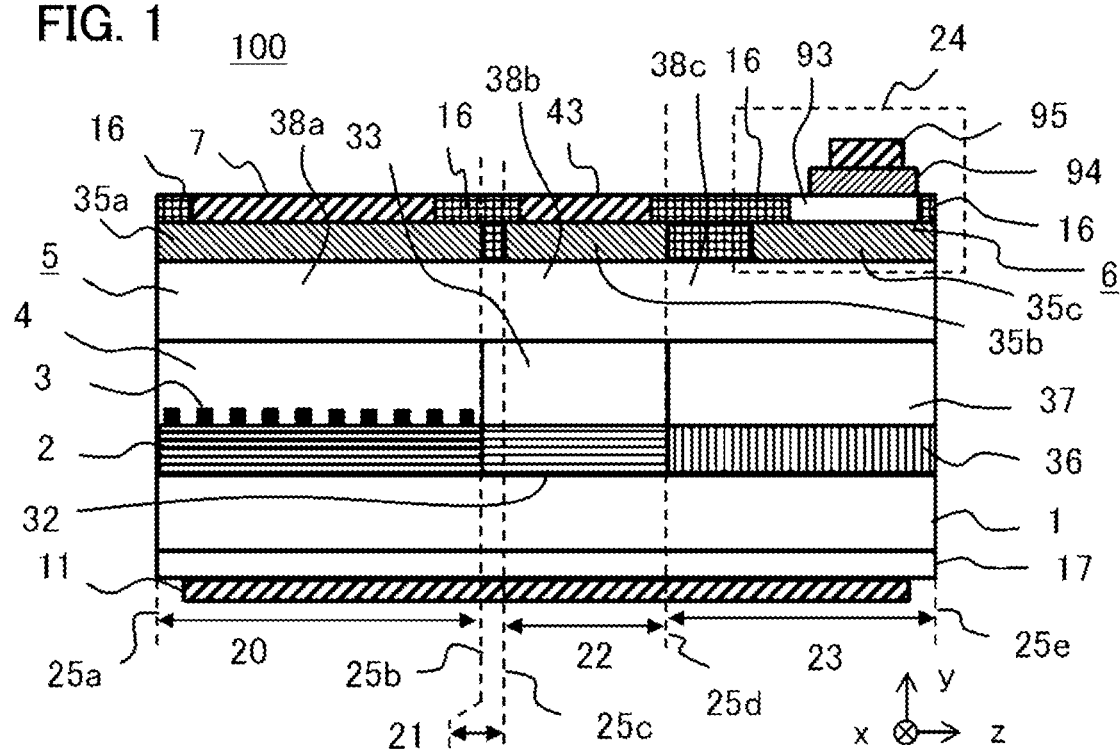
FIG. 1 is a cross-sectional view of a semiconductor laser device according to Embodiment 1.
Figure 2:
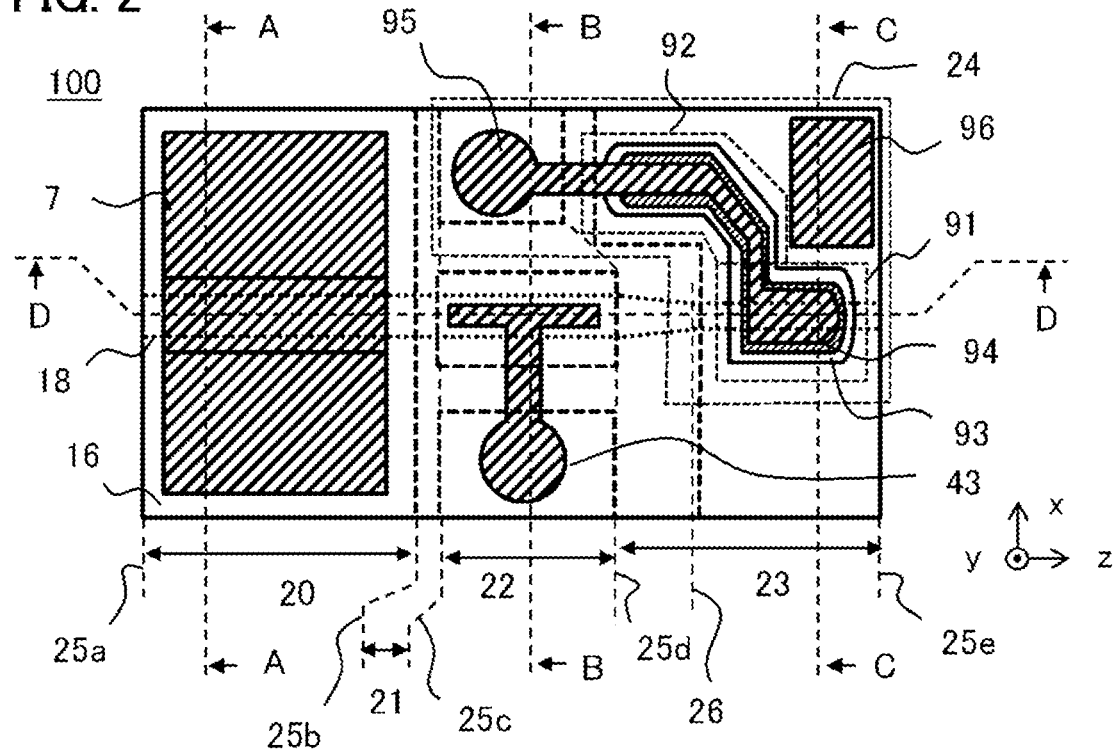
FIG. 2 is a plan view of the semiconductor laser device according to Embodiment 1.
Figure 3:
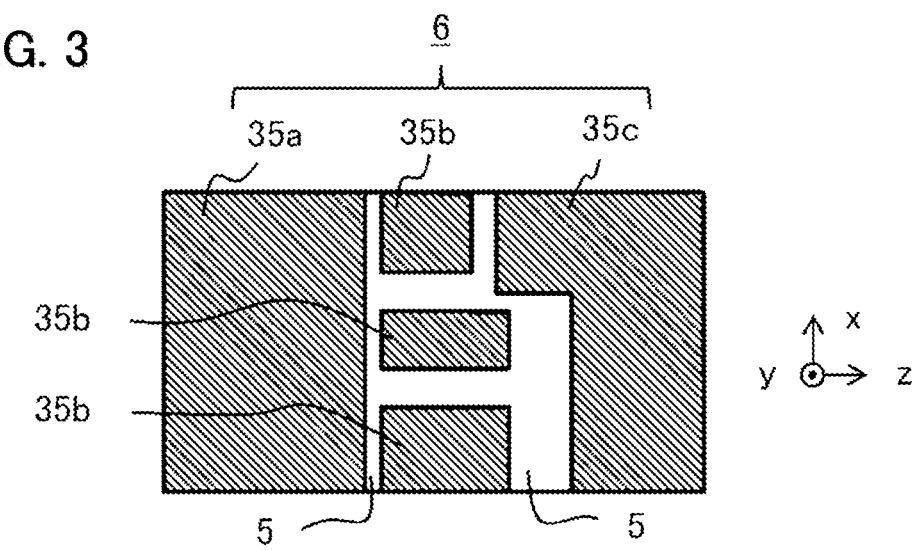
FIG. 3 is a diagram showing a p-type contact layer of the semiconductor laser device according to Embodiment 1.
Figure 4:
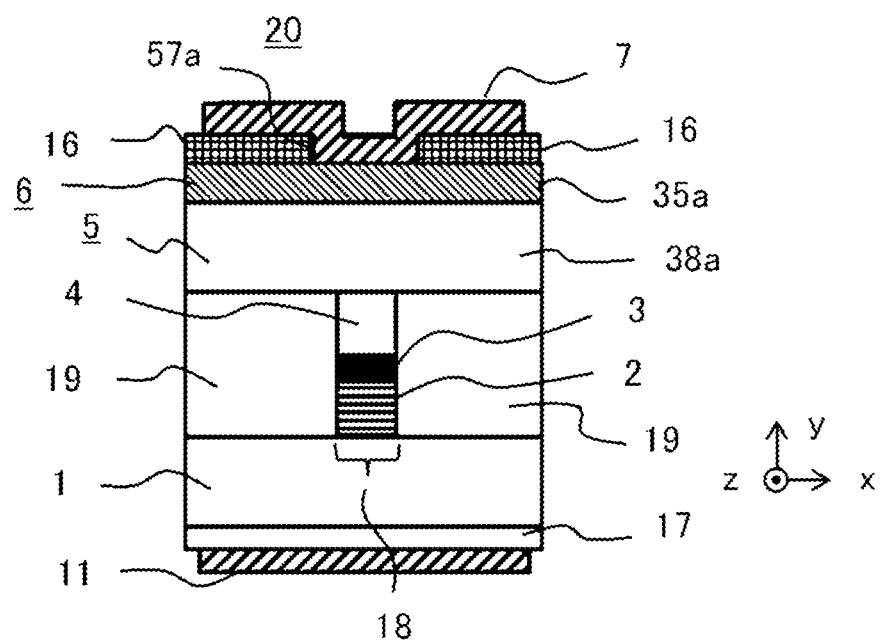
FIG. 4 is a cross-sectional view of a laser part in the semiconductor laser device of FIG. 2.
Figure 5:
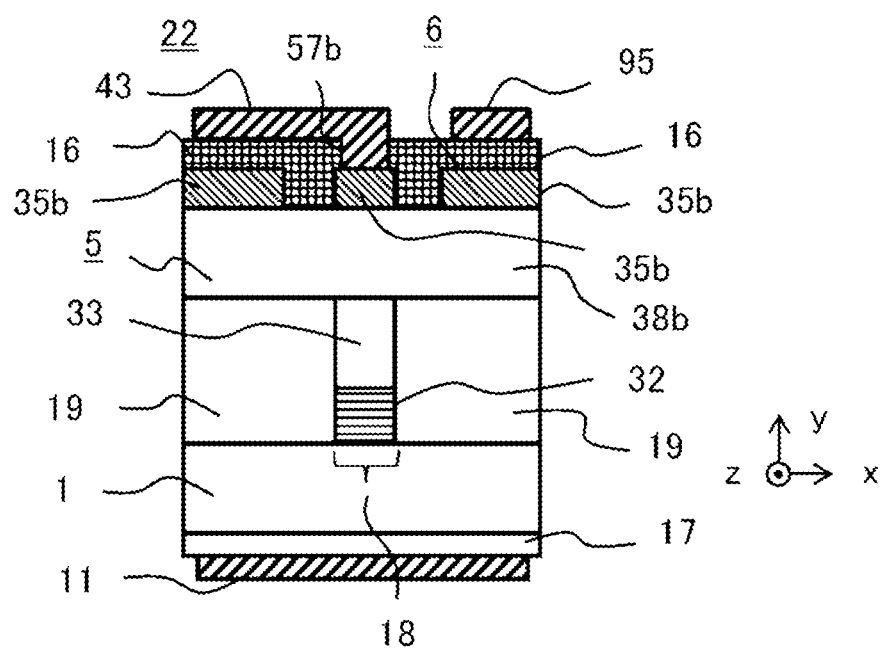
FIG. 5 is a cross-sectional view of a first modulator part in the semiconductor laser device of FIG. 2.
Figure 6:
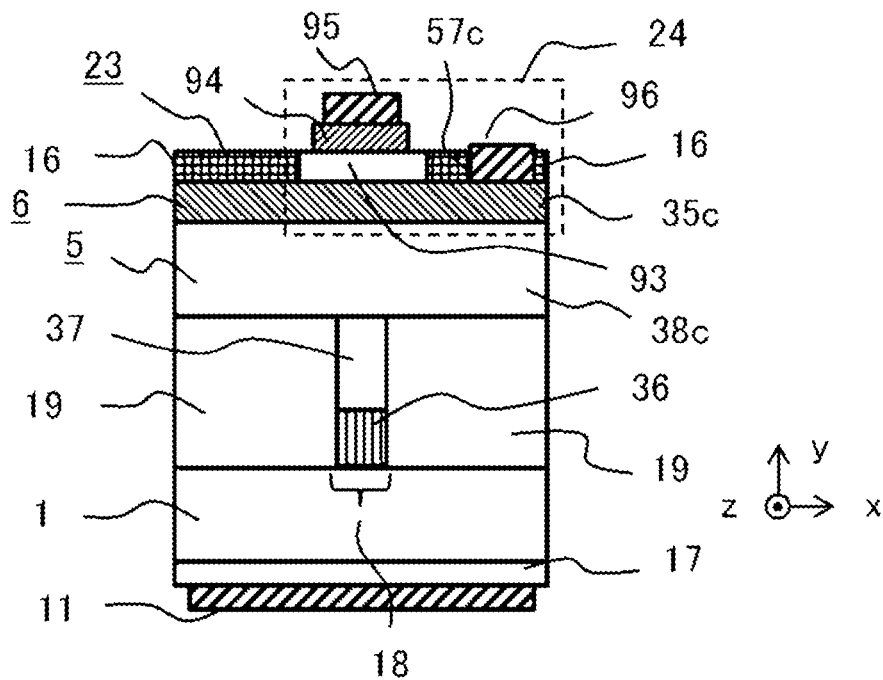
FIG. 6 is a cross-sectional view of a spot size converter part and a photodetector in the semiconductor laser device of FIG. 2.
Figure 7:
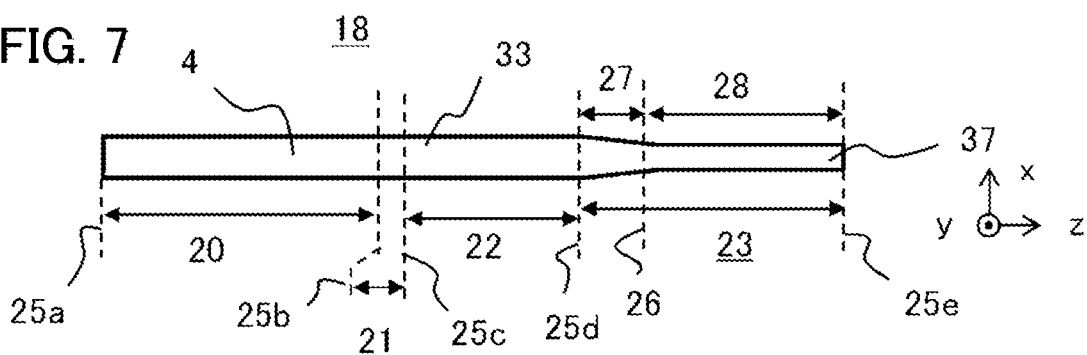
FIG. 7 is a diagram showing a mesa stripe in the semiconductor laser device of FIG. 1.
Figure 8:
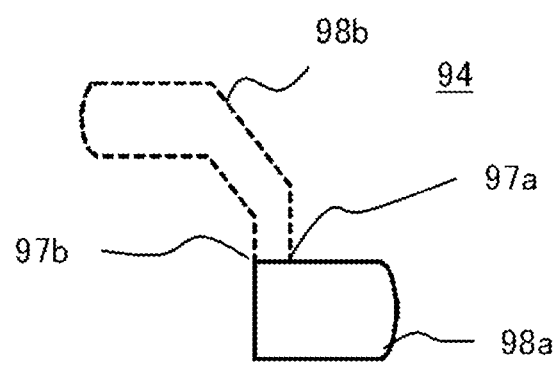
FIG. 8 is a diagram illustrating an outer edge length of an n-type contact layer in the photodetector of FIG. 2.
Figure 9:
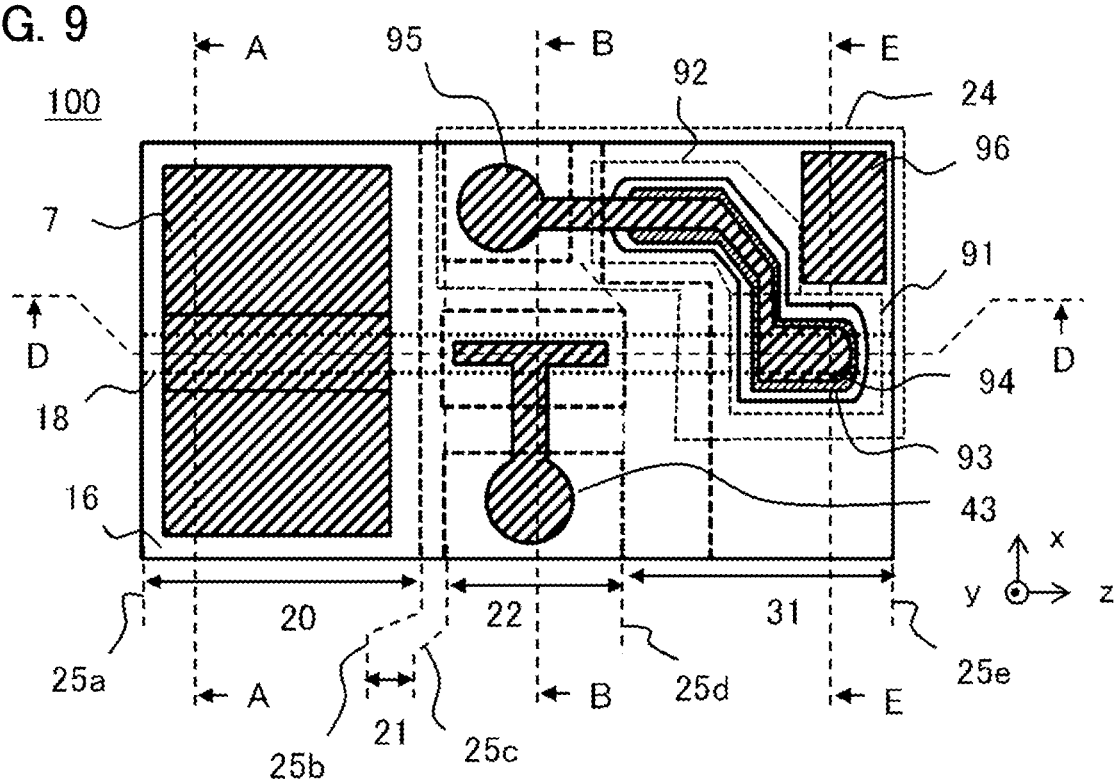
FIG. 9 is a plan view of the other semiconductor laser device according to Embodiment 1.
Figure 10:
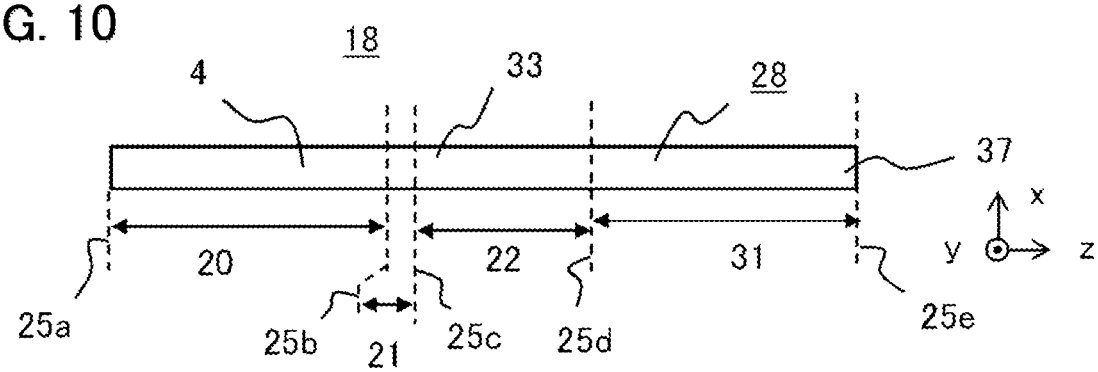
FIG. 10 is a diagram showing a mesa stripe in the other semiconductor laser device of FIG. 9.
Figure 11:
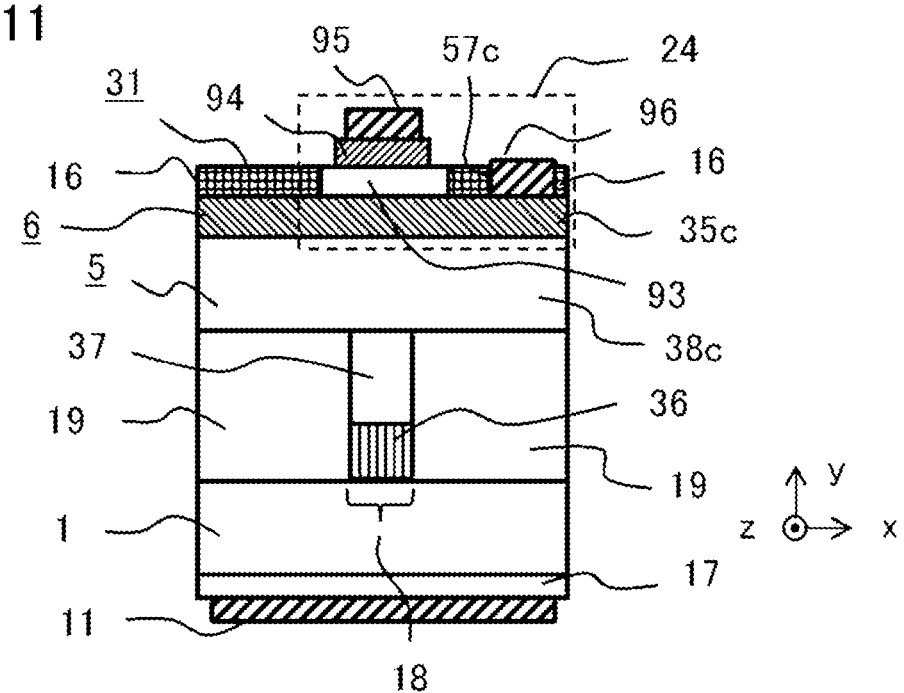
FIG. 11 is a cross-sectional view of a light emitting waveguide part and a photodetector in the other semiconductor laser device of FIG. 9.
Figure 12:
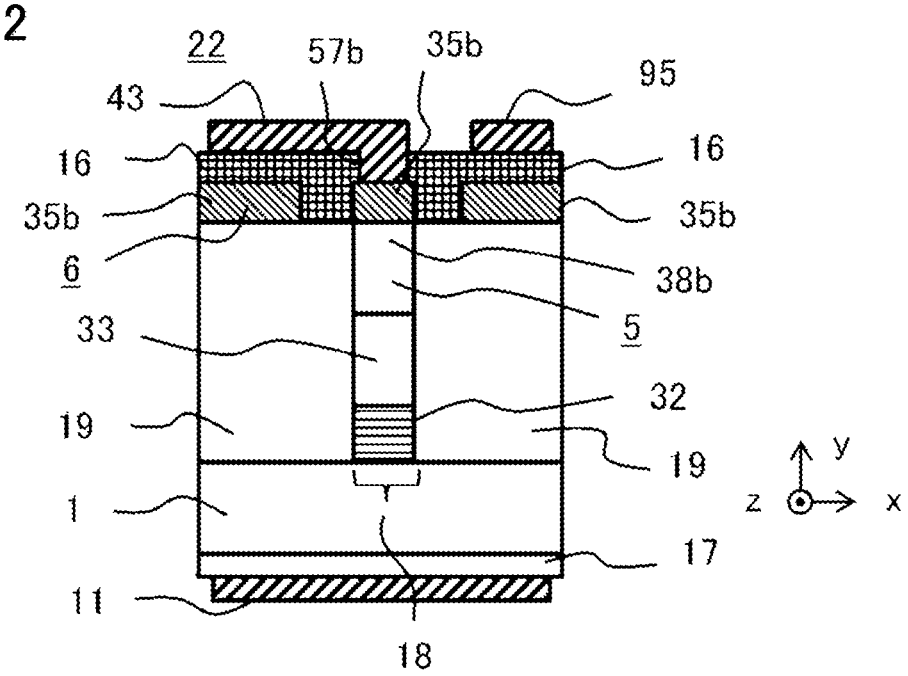
FIG. 12 is a cross-sectional view of a second modulator part in the semiconductor laser device of FIG. 2.

A semiconductor laser device 100 according to Embodiment 1 will be described referring to drawings. The same or corresponding components are denoted by the same reference numerals, and repetitive description may be omitted. In other embodiments, the same or corresponding components are denoted by the same reference numerals, and repetitive description may be omitted. FIG. 1 is a cross-sectional view of a semiconductor laser device according to Embodiment 1, and FIG. 2 is a plan view of the semiconductor laser device according to Embodiment 1. FIG. 3 is a diagram showing a p-type contact layer of the semiconductor laser device according to Embodiment 1, and FIG. 4 is a cross-sectional view of a laser part in the semiconductor laser device of FIG. 2. FIG. 5 is a cross-sectional view of a first modulator part in the semiconductor laser device of FIG. 2, and FIG. 6 is a cross-sectional view of a spot size converter part and a photodetector in the semiconductor laser device of FIG. 2. FIG. 7 is a diagram showing a mesa stripe in the semiconductor laser device of FIG. 1, and FIG. 8 is a diagram illustrating an outer edge length of an n-type contact layer in the photodetector of FIG. 2. FIG. 9 is a plan view of the other semiconductor laser device according to Embodiment 1. FIG. 10 is a diagram showing a mesa stripe in the other semiconductor laser device of FIG. 9, and FIG. 11 is a cross-sectional view of a light emitting waveguide part and a photodetector in the other semiconductor laser device of FIG. 9. FIG. 12 is a cross-sectional view of a second modulator in the semiconductor laser device of FIG. 2. The cross-sectional view of FIG. 1 is a cross-sectional view taken along the dashed line D-D in FIG. 2 or FIG. 9. The cross-sectional views of FIG. 4 to FIG. 6 are those taken along the dashed lines A-A, B-B, and C-C in FIG. 2, respectively. The cross-sectional view of FIG. 11 is that taken along the dashed line E-E in FIG. 9.

The semiconductor laser device 100 of Embodiment 1 includes a laser part 20, a separation part 21, a modulator part 22, a spot size converter part 23, and a photodetector 24. The laser part 20 is formed in a region from a dashed line 25a to a dashed line 25b, and the separation part 21 is formed in a region from the dashed line 25b to a dashed line 25c. The modulator part 22 is formed in a region from the dashed line 25c to the dashed line 25d, and the spot size converter 23 is formed in a region from the dashed line 25d to the dashed line 25e. A main light receiving part 91 and an enlarged part 92 in the photodetector 24 are formed on the front face side of the spot size converter part 23. A distributed feedback laser is formed in the laser part 20. A semiconductor modulator of an electro-absorption type is formed in the modulator part 22, which is for superimposing an electrical input signal on the laser light emitted from the laser part 20, namely, for modulating the laser light. The spot size converter 23 is disposed on the emission side of the modulator part 22, and a spot size converter for converting the beam spot diameter of the laser light output from the modulator part 22 is formed. The separation part 21 separates a contact layer 35a of p-type connected to an anode electrode 7 of the laser part 20 from a contact layer 35b of p-type connected to an anode electrode 43 of the modulator part 22. The modulator part 22 for modulating the laser light is formed between the laser part 20 and the spot size converter part 23.

The photodetector 24 is, for example, a PIN type photodiode. The semiconductor laser device 100 is an integrated optical semiconductor device in which the distributed feedback laser, the semiconductor modulator of the electro-absorption type, the spot size converter, and the photodetector are monolithically formed on a semiconductor substrate 17. In FIG. 1 and FIG. 2, the z-direction is the direction of an optical axis (propagation direction) of the laser light emitted from the laser part 20, the x-direction is the direction perpendicular to the z-direction and the direction in which the layers included in the semiconductor laser device 100 extend, and the y-direction is perpendicular to the z-direction and the x-direction and is the direction in which the layers included in the semiconductor laser device 100 are stacked.

The laser part 20 includes the semiconductor substrate 17 which is an n-type InP substrate, a first cladding layer 1 of n-type InP, an active layer 2, a diffraction grating 3, a second cladding layer 4 of p-type InP, a fifth cladding layer 38a of p-type InP, an embedded layer 19 of InP, the contact layer 35a of p-type InGaAs, an insulating film 16, a cathode electrode 11 formed on the rear surface of the semiconductor substrate 17, and an anode electrode 7 formed on the front surface opposite to the rear surface of the semiconductor substrate 17 and connected to the contact layer 35a. A mesa stripe 18, which is a mesa extending in the propagation direction of the laser light emitted from the laser part 20, is formed in the laser part 20. The mesa stripe 18 of the laser part 20 includes the active layer 2, the diffraction grating 3, and the second cladding layer 4. The side of the mesa stripe 18 is embedded by the embedded layer 19 having a band gap larger than that of the active layer 2.

The surface of the contact layer 35a is covered with the insulating film 16, and the anode electrode 7 is connected to the contact layer 35a via an opening 57a formed in the insulating film 16. The mesa stripe 18 is continuously formed in the laser part 20, the separation part 21, the modulator part 22, and the spot size converter part 23. Although the mesa stripe 18 is continuously formed, the mesa stripe 18 in the laser part 20, the separation part 21, the modulator part 22, and the spot size converter part 23 may be distinguished and denoted as the laser part mesa stripe, the separation part mesa stripe, the modulator part mesa stripe, and the spot size converter part mesa stripe. The mesa stripe 18 in the separation part 21, the modulator part 22, and the spot size converter part 23 is a waveguide that propagates the laser light emitted from the laser part 20.

The modulator part 22 includes the semiconductor substrate 17, the first cladding layer 1 of n-type InP, an absorption layer 32, a third cladding layer 33 of p-type InP, a fifth cladding layer 38b of p-type InP, the embedded layer 19 of InP, the contact layer 35b of p-type InGaAs, the insulating film 16, the cathode electrode 11 formed on the rear surface of the semiconductor substrate 17, and the anode electrode 43 formed on the front surface of the semiconductor substrate 17 and connected to the contact layer 35b. The mesa stripe 18 of the modulator part 22 includes the absorption layer 32 and the third cladding layer 33. The side of the mesa stripe 18 is embedded by the embedded layer 19. The surface of the contact layer 35b is covered with the insulating film 16, and the anode electrode 43 is connected to the contact layer 35b via an opening 57b formed in the insulating film 16. The absorption layer 32 of the modulator part 22 is connected to the active layer 2 of the laser part 20. Note that, in FIG. 5, a cathode electrode 95 of the photodetector 24 is also shown.

The spot size converter part 23 includes the semiconductor substrate 17, the first cladding layer 1 of n-type InP, a waveguide layer 36, a fourth cladding layer 37 of p-type InP, a fifth cladding layer 38c of p-type InP, the embedded layer 19 of InP, a contact layer 35c of p-type InGaAs, the insulating film 16, and the cathode electrode 11 formed on the rear surface of the semiconductor substrate 17. The mesa stripe 18 of the spot size converter 23 includes the waveguide layer 36 and the fourth cladding layer 37. The side of the mesa stripe 18 is embedded by the embedded layer 19. The waveguide layer 36 of the spot size converter part 23 is connected to the absorption layer 32 of the modulator part 22. As shown in FIG. 7, the mesa stripe 18 of the spot size converter part 23 includes a tapered portion 27 in a tapered shape which has a width in the x-direction narrowed toward the propagation direction of the laser light incident from the absorption layer 32 in the mesa stripe 18 of the modulator part 22, and an output waveguide part 28 having a width narrower than the width in the x-direction of the mesa stripe 18 of the modulator part 22. The tapered portion 27 is formed in a region between the dashed line 25d and a dashed line 26, and the output waveguide part 28 is formed in a region between the dashed line 26 and the dashed line 25e. The output waveguide part 28 is connected to the downstream side of the tapered portion 27 in the propagation direction of the laser light. The spot size converter 23 may be expressed as a waveguide having the tapered portion 27 and the output waveguide part 28.

FIG. 2 and FIG. 7 show an example in which the width of the mesa stripe 18 of the laser part 20 in the x-direction, the width of the mesa stripe 18 of the modulator part 22 in the x-direction, and the width of the mesa stripe 18 of the separation part 21 in the x-direction are equal to each other. The laser light emitted by the laser part 20 propagates through the active layer 2, the absorption layer 32, and the waveguide layer 36 of the mesa stripe 18 and is emitted from the semiconductor laser device 100. FIG. 7 shows surfaces of the second cladding layer 4, the third cladding layer 33, and the fourth cladding layer 37 in the y-direction, which are the outermost surfaces of the mesa stripe 18 in the laser part 20, the separation part 21, the modulator part 22, and the spot size converter part 23.

The contact layer 35c formed on the surface of the fifth cladding layer 38c of the spot size converter part 23 is a layer connected to an anode electrode 96 of the photodetector 24. In Embodiment 1, it is desirable that cladding layers of p-type InP formed on the surfaces of the second cladding layer 4 of the laser part 20, the third cladding layer 33 of the separation part 21 and the modulator part 22, and the fourth cladding layer 37 of the spot size converter part 23 be formed by the same stacking process from the viewpoint of simplifying the manufacturing process. Therefore, the cladding layers of p-type InP formed on the surfaces of the second cladding layer 4 of the laser part 20, the third cladding layer 33 of the separation part 21 and the modulator part 22, and the fourth cladding layer 37 of the spot size converter part 23 are denoted as a fifth cladding layer 5 collectively. It is desirable that the p-type InGaAs contact layers 35a, 35b, and 35c formed on the surface of the fifth cladding layer 5 also be formed in the same stacking process from the viewpoint of simplifying the manufacturing process. Therefore, in Embodiment 1, an example is shown in which the contact layers 35a, 35b, and 35c are pattered in a p-type InGaAs contact layer 6. FIG. 3 shows surface shapes of the contact layers 35a, 35b, and 35c. In FIG. 2 and FIG. 9, the boundaries of the contact layers 35a, 35b and 35c are indicated by dashed lines so as not to be complicated, and a fill pattern of the insulating film 16 is omitted.

In the laser part 20 and the modulator part 22, from the viewpoint of performance, it is required to reduce the contact resistance between the anode electrodes 7, 43 and the contact layers 35a, 35b of p-type InGaAs, respectively. Therefore, the impurity concentration of the p-type InGaAs contact layer 6 is set to a high concentration of $1.0 \times 10^{19}$ $cm^{-3}$. Note that the fifth cladding layers 38a, 38b, and 38c of p-type InP formed respectively on the surfaces of the second cladding layer 4 of the laser part 20, the third cladding layer 33 of the separation part 21 and the modulator part 22, and the fourth cladding layer 37 of the spot size converter part 23 may be formed in separate processes. When the fifth cladding layers 38a, 38b, and 38c of p-type InP respectively formed on the surfaces of the second cladding layer 4 of the laser part 20, the third cladding layer 33 of the separation part 21 and the modulator part 22, and the fourth cladding layer 37 of the spot size converter part 23 are formed in separate processes, the value of the current (monitor current) detected by the photodetector 24 can be increased by making the optical confinement performance of the spot size converter part 23 weak while increasing the optical confinement performance of the laser part 20 and the modulator part 22. Further, each of the contact layers 35a, 35b, and 35c may be formed in a separate process.

As shown in FIG. 2, the photodetector 24 includes the main light receiving part 91 disposed so as to encompass the mesa stripe 18 on the front face side thereof, that is, above the mesa stripe 18 in the spot size converter part 23, and the enlarged part 92 disposed outside the mesa stripe 18, not encompassing the mesa stripe 18 on the front face side thereof. In the cross-sectional structure of the photodetector 24, an undoped layer 93 of undoped InP and an n-type InGaAsP contact layer 94 are stacked in this order on the surface of the contact layer 35c. The cathode electrode 95 of the photodetector 24 is connected to the surface of the n-type InGaAsP contact layer 94. In addition, on the outer side of the cathode electrode 95, the anode electrode 96 is connected to the contact layer 35c via an opening 57c of the insulating film 16.

The main light receiving part 91 is a part that encompasses the mesa stripe 18, and the boundary with the enlarged part 92 may be set anywhere as long as it is apart from the mesa stripe 18. In FIG. 2, the main light receiving part 91 is shown as a part in which the width of the undoped layer 93 in the z-direction is not smaller than a half of the width (reference width) of the undoped layer 93 in the z-direction in the portion right above the mesa stripe 18, that is, the portion encompassing the mesa stripe 18, a part which is located on the positive side in the z-direction from the boundary on the laser part 20 side in the portion crossing the mesa stripe 18 in the p-type contact layer 35c of the photodetector 24, and a part in which the width perpendicular to the extending direction of the undoped layer 93 (width in the x-direction) does not decrease sharply.

FIG. 2 shows an example in which the main light receiving part 91 is disposed on the downstream side in the propagation direction of the laser light from the boundary (the portion indicated by the dashed line 26) between the tapered portion 27 and the output waveguide part 28 in the mesa stripe 18 of the spot size converter part 23, that is, on the positive side in the z-direction. FIG. 2 shows an example in which the enlarged part 92 is disposed so as to extend from the portion connected to the main light receiving part 91 to the upstream side in the propagation direction of the laser light, that is, to the negative side in the z-direction.

Next, operation of the semiconductor laser device 100 according to Embodiment 1 will be described. The laser light emitted from the laser part 20 is converted into signal light by superimposing an electric input signal on the laser light by the modulator part 22, that is, by modulating the electric input signal. The signal light includes light emission and non-light emission, that is, an on-state and an off-state. Thereafter, the signal light is emitted from the modulator part 22 to the outside of the semiconductor laser device 100 via the spot size converter 23. At this time, a part of the signal light enters the main light receiving part 91 of the photodetector 24 disposed above the spot size converter part 23 due to leakage upward in the mesa stripe 18 of the spot size converter part 23 or reflection at the emission end face (end face indicated by a dashed line 25e) of the semiconductor laser device 100. A reverse bias is applied to the photodetector 24 between the anode electrode 96 and the cathode electrode 95. The photodetector 24 photoelectrically converts the laser light incident from the contact layer 35c of p-type InGaAs at the undoped layer 93 of undoped InP and outputs the photoelectrically converted current to an external circuit as a monitor current proportional to the output light intensity of the laser light emitted from the laser part 20.

In the semiconductor laser device 100 according to Embodiment 1, since the impurity concentration of the p-type contact layer 35c of the photodetector 24, which is $1.0 \times 10^{19}$ cm$^{-3}$, is high, the thickness of the depletion layer generated when a high voltage is applied to the photodetector 24 is reduced, and thus current concentration occurs in the outer edge of the n-type contact layer 94 as described before. However, the semiconductor laser device 100 of Embodiment 1 is different from the distributed feedback semiconductor laser with a monitor in Patent Document 1 in which the photodetector 24 has only the main light receiving part 91. Since the semiconductor laser device 100 includes the main light receiving part 91 and the enlarged part 92, the length of the outer edge of the n-type contact layer 94 of the photodetector 24, that is, the outer edge length, is longer than that of the photodetector having only the main light receiving part. Therefore, in the semiconductor laser device 100 according to Embodiment 1, since the amount of current per unit length at the outer edge of the n-type contact layer 94 of the photodetector 24 decreases in inverse proportion to the outer edge length, the resistance of the photodetector 24 to an applied high voltage, that is, an ESD withstand voltage, can be improved.

The outer edge length of the n-type contact layer 94 in the photodetector 24 of Embodiment 1 and the outer edge length of the n-type contact layer 94 in the photodetector (comparative example) having only the main light receiving part 91 will be described referring to FIG. 8. The n-type contact layer 94 in the photodetector of the comparative example is a contact layer 98a in a region indicated by the solid line. The n-type contact layer 94 in the photodetector 24 of Embodiment 1 is a combined region of the contact layer 98a in the region indicated by the solid line and a contact layer 98b in the region indicated by the dashed line. Since the contact layer 98b in the region indicated by the dashed line is an enlarged region from the contact layer 98a in the main light receiving part 91 of the photodetector of the comparative example, the contact layer 98b can be regarded as the contact layer of the enlarged part 92. The photodetector 24 of Embodiment 1 is longer than the photodetector of the comparative example by the length obtained by subtracting the length from the point 97a to the point 97b on the solid line in the contact layer 98a from the length of the dashed line from the point 97a to the point 97b in the contact layer 98b.

Note that, in the photodetector of the comparative example having only the main light receiving part 91, since it is generally considered that the shape of the contact layer 94 is not the same as the shape of the contact layer 94 in the region indicating the main light receiving part 91 in FIG. 2, the contact layer 94 of the main light receiving part 91 is shown in the solid line, and the contact layer 94 of the enlarged part 92 is shown in the dashed line in FIG. 8. A portion indicated by the solid line from the point 97a to the point 97b is a boundary between the contact layer 94 of the main light receiving part 91 and the contact layer 94 of the enlarged part 92. Using the length of the boundary, the following description can be applied. The photodetector 24 of Embodiment 1 is longer than the photodetector having only the main light receiving part 91 by a length obtained by subtracting the length of the boundary between the main light receiving part 91 and the enlarged part 92 from the outer edge length of the contact layer 94 in the enlarged part 92. In the photodetector 24 of Embodiment 1, by increasing the outer edge length of the contact layer 94 in the enlarged part 92, the outer edge length of the main light receiving part 91 and the enlarged part 92 in total can be increased.

The semiconductor laser device 100 of Embodiment 1 is provided with the spot size converter part 23 including the tapered portion 27 in which the waveguide layer 36 is tapered in the propagation direction (z-direction) of the laser light, so that a spot size of a near-field pattern (NFP) in the laser light of the laser part 20 can be widened and a beam spread angle of a far-field pattern (FFP) can be narrowed. Thus, a low-magnification lens can be used in an optical module product or an optical transceiver product using the semiconductor laser device 100 of Embodiment 1 including the spot size converter 23.

A method for manufacturing the semiconductor laser device 100 will be described. The first cladding layer 1 is crystal-grown on the surface of the semiconductor substrate 17 by a method of metal organic chemical vapor deposition (MOCVD). The active layer 2, the absorption layer 32, and the waveguide layer 36 are formed by crystal growth using the MOCVD method and dry etching using an $SiO_2$ mask for each of corresponding regions for the laser part 20, the separation part 21, the modulator part 22, and the spot size converter part 23 on the surface of the first cladding layer 1. The diffraction grating 3 is formed on the surface of the active layer 2 of the laser part 20 by crystal growth using the MOCVD method and dry etching using an $SiO_2$ mask. The second cladding layer 4, the third cladding layer 33, and the fourth cladding layer 37 are formed for each of corresponding surfaces for the diffraction grating 3, the absorption layer 32, and the waveguide layer 36 by crystal growth using the MOCVD method and dry etching using an $SiO_2$ mask. An $SiO_2$ mask having the same shape as the surface shape of the mesa stripe 18 is formed on the surfaces of the second cladding layer 4, the third cladding layer 33, and the fourth cladding layer 37, and the mesa stripe 18 is formed by dry etching using this $SiO_2$ mask. Then, the embedded layer 19 is crystal-grown in the exposed first cladding layer 1 on both sides of the mesa stripe 18.

The $SiO_2$ mask is removed, the fifth cladding layer 5 and the contact layer 6 are sequentially crystal-grown on the surfaces of the embedded layer 19 and the mesa stripe 18, and the contact layer 6 is patterned by wet etching using a photoresist mask. After the photoresist mask is removed, the undoped layer 93 of the photodetector 24 is formed on the surface of the contact layer 6 by crystal growth using the MOCVD method and dry etching using an $SiO_2$ mask. The $SiO_2$ mask is removed, and the insulating film 16 is formed on the surfaces of the contact layer 6, the exposed fifth cladding layer 5, and the undoped layer 93. The insulating film 16 on the surface of the undoped layer 93 is removed by dry etching using a photoresist mask, and the contact layer 94 is formed on the exposed surface of the undoped layer 93 by crystal growth using the MOCVD method and dry etching using an $SiO_2$ mask. An $SiO_2$ mask on the surface of the contact layer 94 is removed, and the openings 57a, 57b, and 57c of the insulating film 16 for connecting the anode electrode 7, the anode electrode 43, and the anode electrode 96 to the contact layer 6 are formed by wet etching using a photoresist mask. The photoresist mask is removed, a metal layer is formed on the front and rear surfaces of the semiconductor laser device 100, and the cathode electrode 11, the anode electrode 7, the anode electrode 43, the cathode electrode 95, and the anode electrode 96 are formed.

Note that, although FIG. 2 shows an example in which the diffraction grating 3 is formed such that the active layer 2 below is exposed, the diffraction grating 3 may be formed with a recess in the y-direction such that the active layer 2 below is not exposed. Further, although an example is described in which the fifth cladding layer 5 is formed together in the regions of the laser part 20, the separation part 21, the modulator part 22, and the spot size converter part 23, the fifth cladding layers 38a, 38b, and 38c may be formed individually in separate processes. Although an example is described in which the contact layer 6 is formed together in the regions of the laser part 20, the separation part 21, the modulator part 22, and the spot size converter part 23, the contact layers 35a, 35b, and 35c may be formed individually in separate processes.

Although an example in which the tapered portion 27 and the output waveguide part 28 are disposed on the downstream side of the modulator part 22 in the propagation direction of the laser light is described so far, as shown in FIG. 10, a light emitting waveguide part 31 in which only the output waveguide part 28 is provided without the tapered portion 27 may be disposed on the downstream side of the modulator part 22 in the propagation direction of the laser light. In a cross section perpendicular to the z-direction of the light emitting waveguide part 31 and the photodetector 24 in FIG. 11, the width of the mesa stripe 18 in the x-direction is larger than the width of the mesa stripe 18 in the x-direction in FIG. 6. The other semiconductor laser device 100 according to Embodiment 1 shown in FIG. 9 to FIG. 11 is an example in which the laser part 20, the separation part 21, the modulator part 22, and the light emitting waveguide part 31 are included. Also in this case, in the other semiconductor laser device 100 of Embodiment 1, the photodetector 24 is different from the distributed feedback semiconductor laser with a monitor in Patent Document 1 in that the photodetector 24 is provided with the main light receiving part 91 and the enlarged part 92, so that the length of the outer edge of the n-type contact layer 94 of the photodetector 24, that is, the outer edge length, is longer than that of the photodetector having only the main light receiving part. Therefore, in the other semiconductor laser device 100 of Embodiment 1, since the amount of current per unit length at the outer edge of the n-type contact layer 94 of the photodetector 24 is reduced in inverse proportion to the outer edge length, the resistance of the photodetector 24 to an applied high voltage can be improved. In the other semiconductor laser device 100 according to Embodiment 1, since the photodetector 24 has high resistance to an applied high voltage, the ESD withstand voltage of the photodetector 24 can be improved.

Note that the cross-sectional structure of the modulator part 22 is not limited to the cross-sectional structure shown in FIG. 5 and may be a cross-sectional structure shown in FIG. 12. The cross-sectional structure of the modulator part 22 shown in FIG. 12 differs from the cross-sectional structure of the modulator part 22 shown in FIG. 5 in that, in the modulator part 22, the fifth cladding layer 38b is formed in a mesa shape on the surface of the mesa stripe 18, the embedded layer 19 fills in the side of the fifth cladding layer 38b, and the contact layer 35b is formed on the surface of the fifth cladding layer 38b and the embedded layer 19. Next, in the manufacturing method for a second modulator part 22 shown in FIG. 12, the difference from a first modulator part 22 shown in FIG. 5 will be mainly described. After the embedded layer 19 is crystal-grown on the exposed first cladding layer 1 on both sides of the mesa stripe 18, an $SiO_2$ mask is removed, and the fifth cladding layer 5 is crystal-grown on the surface of the embedded layer 19 and the mesa stripe 18 in the modulator part 22.

An $SiO_2$ mask for forming the mesa is formed on the fifth cladding layer 5 of the modulator part 22, and the fifth cladding layer 5 in the modulator part 22 is removed by dry etching in a portion where the opening of the $SiO_2$ mask is formed, thereby exposing the embedded layer 19. Thereafter, the embedded layer 19 is crystal-grown on the exposed surface of the embedded layer 19. The $SiO_2$ mask is removed, and the contact layer 6 is crystal-grown on the surfaces of the fifth cladding layer 5 and the embedded layer 19 in the laser part 20, the separation part 21, the modulator part 22, and the spot size converter part 23. The subsequent method including the patterning of the contact layer 6 is the same as that described before.

As described above, the semiconductor laser device 100 of Embodiment 1 is a semiconductor laser device in which the laser part 20 for emitting the laser light, the waveguide (output waveguide part 28) for propagating the laser light emitted from the laser part 20, and the photodetector 24 for detecting the laser light emitted from the laser part 20 are formed on the same semiconductor substrate 17. The photodetector 24 includes the anode electrode 96, the cathode electrode 95, the p-type contact layer 35c which is formed above the waveguide (output waveguide part 28) on the side opposite to the semiconductor substrate 17 and is connected to the anode electrode 96, the n-type contact layer 94 connected to the cathode electrode 95, and the undoped layer 93 formed between the p-type contact layer 35c and the n-type contact layer 94. The undoped layer 93 and the n-type contact layer 94 in the photodetector 24 include the main light receiving part 91 disposed above the waveguide (output waveguide part 28) so as to encompass the waveguide (output waveguide part 28), and the enlarged part 92 that is connected to the main light receiving part 91 while disposed so as not to encompass the waveguide (output waveguide part 28). With the structure in the semiconductor laser device 100 of Embodiment 1, since the photodetector 24 includes the main light receiving part 91 and the enlarged part 92 connected to the main light receiving part 91, the ESD withstand voltage of the photodetector 24 can be increased.

In the semiconductor laser device 100 of Embodiment 1, although an example of the photodetector 24 in which the enlarged part 92 is disposed so as to extend to the positive side of the x-direction of the mesa stripe 18 is shown, the surface shape of the photodetector 24 is not limited to the example shown in FIG. 2, and other surface shapes may be used. Examples in which the surface shape of the photodetector 24 is different are shown in Embodiments 2 to 4.

Embodiment 2

Figure 13:
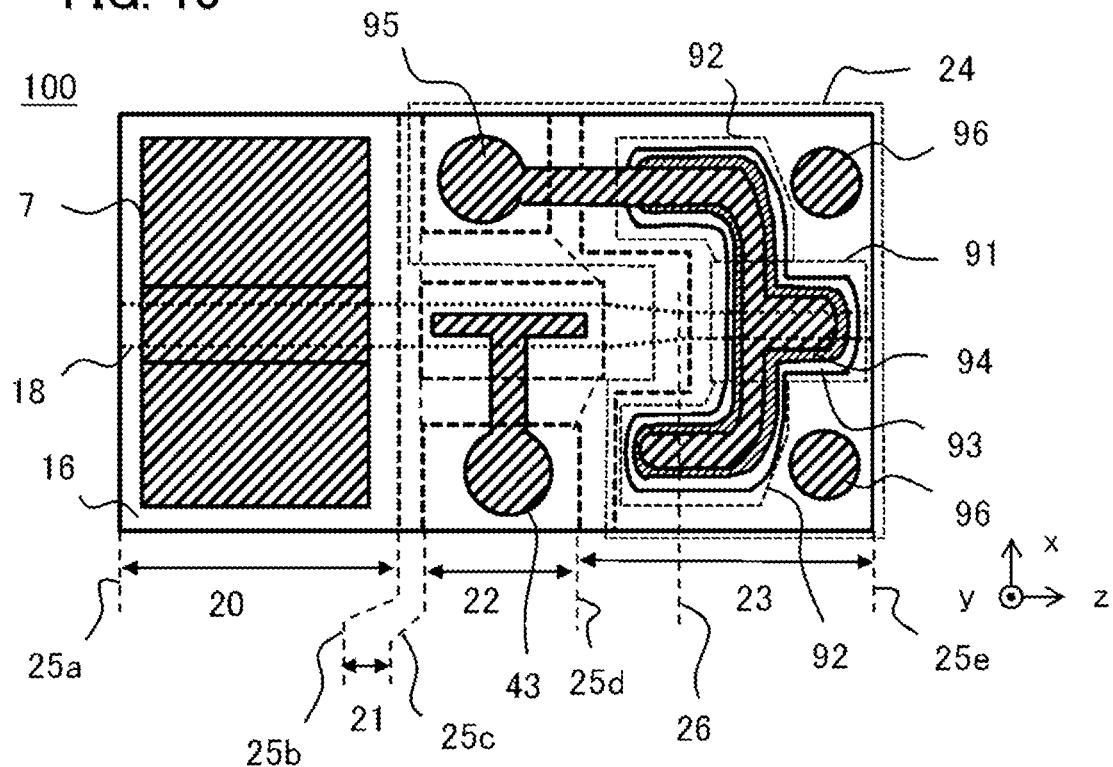
FIG. 13 is a plan view of the semiconductor laser device according to Embodiment 2.
Figure 14:
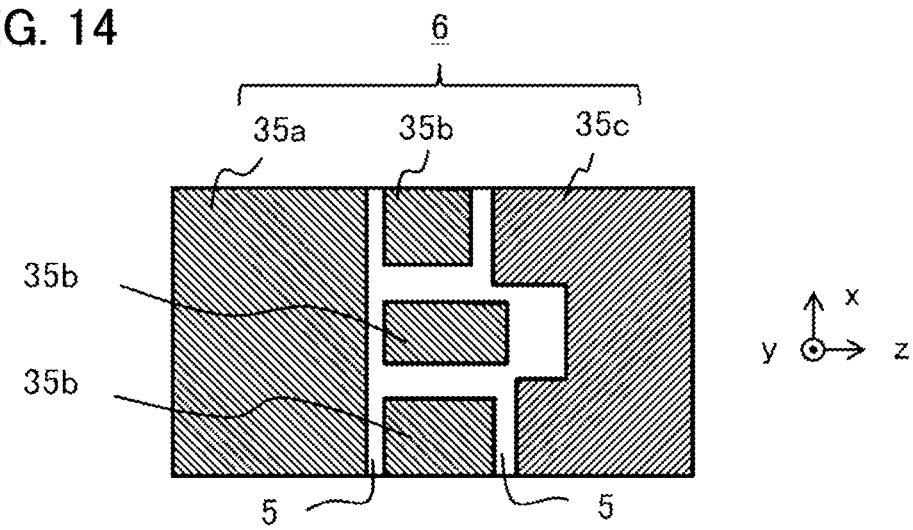
FIG. 14 is a diagram showing a p-type contact layer of the semiconductor laser device of FIG. 13.

FIG. 13 is a plan view of a semiconductor laser device according to Embodiment 2, and FIG. 14 is a diagram showing a p-type contact layer of the semiconductor laser device of FIG. 13. The semiconductor laser device 100 of Embodiment 2 is different from the semiconductor laser device 100 of Embodiment 1 in that the semiconductor laser device 100 includes two enlarged parts 92 and two anode electrodes 96 of the photodetector 24. Differences from the semiconductor laser device 100 of Embodiment 1 will mainly be described.

The photodetector 24 of Embodiment 2 includes one main light receiving part 91 and two enlarged part 92. One enlarged part 92 is disposed to extend to the positive side of the mesa stripe 18 in the x-direction, and the other enlarged part 92 is disposed to extend to the negative side of the mesa stripe 18 in the x-direction. The undoped layer 93 and the contact layer 94 extend to the positive and negative sides of the mesa stripe 18 in the x-direction and their surface shape are in a Y-shaped. Since the photodetector 24 of Embodiment 2 includes the two enlarged parts 92, an outer edge length of the n-type contact layer 94 of the photodetector 24 can be made longer than that of the photodetector 24 of Embodiment 1.

In the semiconductor laser device 100 of Embodiment 2, since the outer edge length of the n-type contact layer 94 of the photodetector 24 is longer than that of the semiconductor laser device 100 of Embodiment 1, the ESD withstand voltage of the photodetector 24 can be made higher than that of the semiconductor laser device 100 of Embodiment 1. Since the semiconductor laser device 100 of Embodiment 2 has the same structure except for the difference described above, the same effects as those of the semiconductor laser device 100 of Embodiment 1 can be obtained.

Embodiment 3

Figure 15:
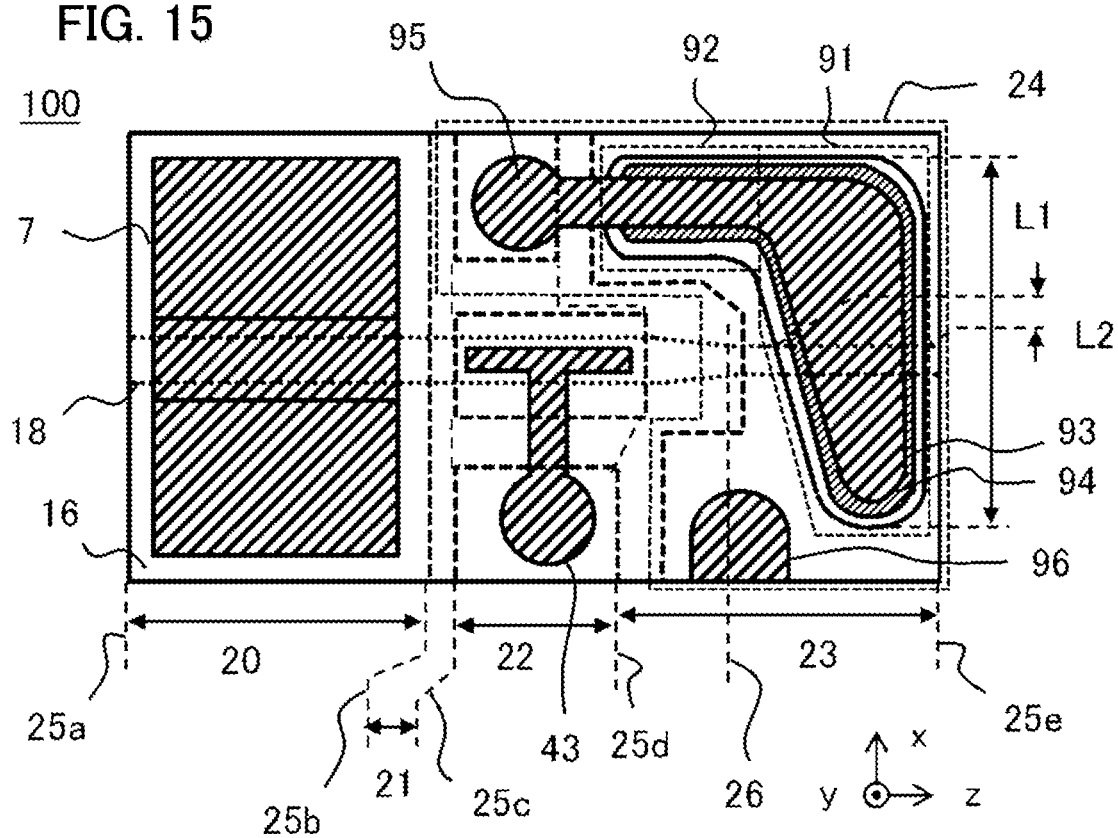
FIG. 15 is a plan view of a semiconductor laser device according to Embodiment 3.
Figure 16:
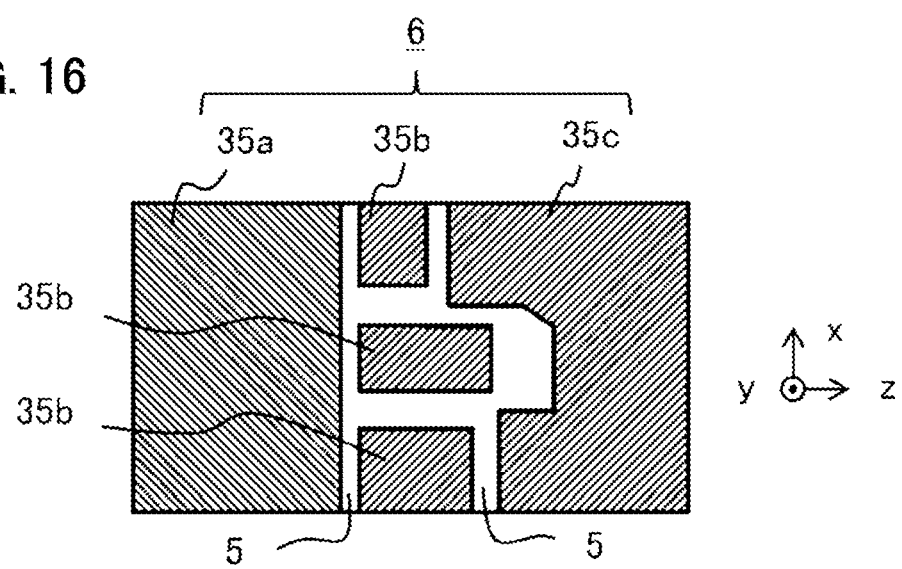
FIG. 16 is a diagram showing a p-type contact layer of the semiconductor laser device of FIG. 15.

FIG. 15 is a plan view of a semiconductor laser device according to Embodiment 3, and FIG. 16 is a diagram showing a p-type contact layer of the semiconductor laser device of FIG. 15. The semiconductor laser device 100 of Embodiment 3 is different from the semiconductor laser device 100 of Embodiment 1 in that the main light receiving part 91 extends to the positive side and the negative side of the mesa stripe 18 in the x-direction. Differences from the semiconductor laser device 100 of Embodiment 1 will mainly be described.

As described above, the main light receiving part 91 is a part that encompasses the mesa stripe 18, and the boundary with the enlarged part 92 may be set anywhere as long as it is apart from the mesa stripe 18. In FIG. 15, the main light receiving part 91 is shown as a part in which the width of the undoped layer 93 in the z-direction is not smaller than a half of the width (reference width) of the undoped layer 93 in the z-direction in the portion right above the mesa stripe 18, that is, the portion encompassing the mesa stripe 18, a part which is located on the positive side in the z-direction from the boundary on the laser part 20 side in the portion crossing the mesa stripe 18 in the p-type contact layer 35c of the photodetector 24, and a part in which the width perpendicular to the extending direction of the undoped layer 93 (width in the x-direction) does not decrease sharply. Note that, as shown in FIG. 15, a portion where the width of the undoped layer 93 in the z-direction is smaller than a half of the reference width is included in the main light receiving part 91 in accordance with the tip shape of the n-type contact layer 94. Further, in the main light receiving part 91, a length L1 of the undoped layer 93 in the x-direction, which is a direction perpendicular to the z-direction being the propagation direction of the laser light and in which the semiconductor substrate 17 extends, is longer than a length L2 of the undoped layer 93 in the z-direction in the portion encompassing the waveguide, that is, the output waveguide part 28 (refer to FIG. 7) of the spot size converter part 23.

In the photodetector 24 of Embodiment 3, since the region of the main light receiving part 91 is larger than the region of the main light receiving part 91 in the photodetector 24 of Embodiment 1, the outer edge length of the n-type contact layer 94 of the photodetector 24 can be made longer than that of the photodetector 24 of Embodiment 1. In the semiconductor laser device 100 of Embodiment 3, since the outer edge length of the n-type contact layer 94 of the photodetector 24 is longer than that of the semiconductor laser device 100 of Embodiment 1, the ESD withstand voltage of the photodetector 24 can be made higher than that of the semiconductor laser device 100 of Embodiment 1. Since the semiconductor laser device 100 of Embodiment 3 has the same structure except for the difference described above, the same effects as those of the semiconductor laser device 100 of Embodiment 1 can be obtained.

Embodiment 4

Figure 17:
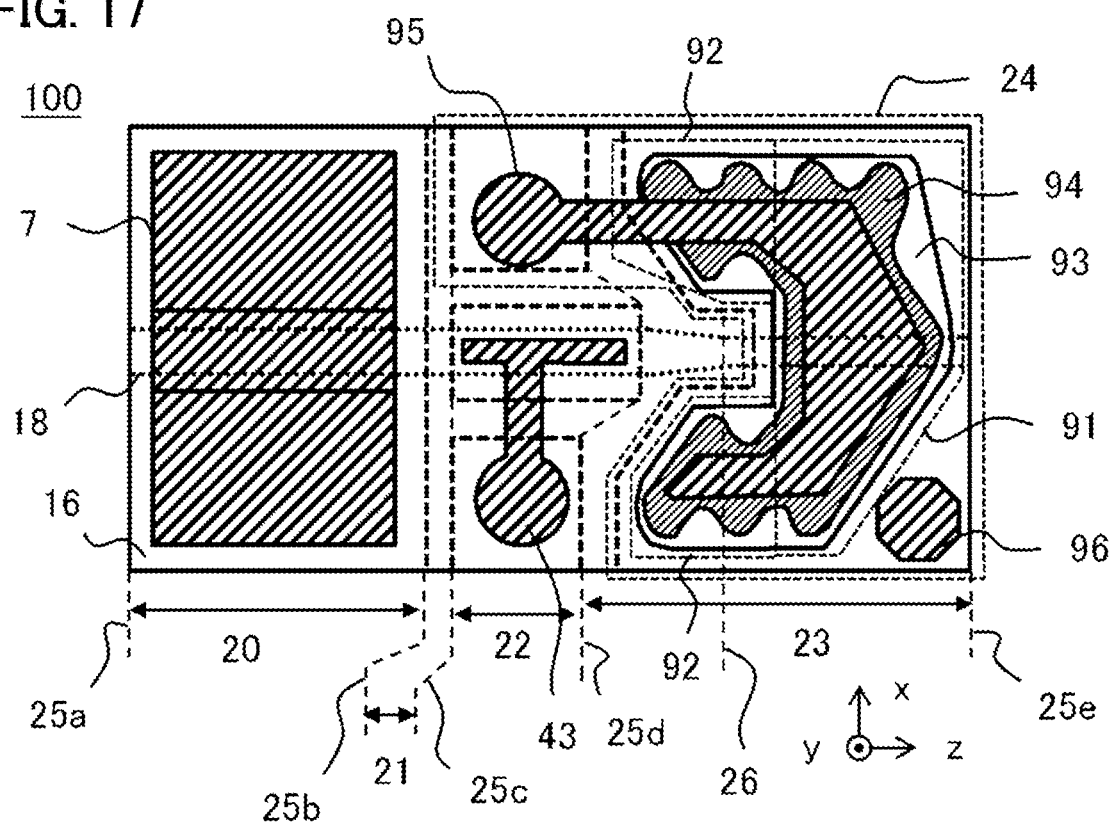
FIG. 17 is a plan view of a semiconductor laser device according to Embodiment 4.
Figure 18:
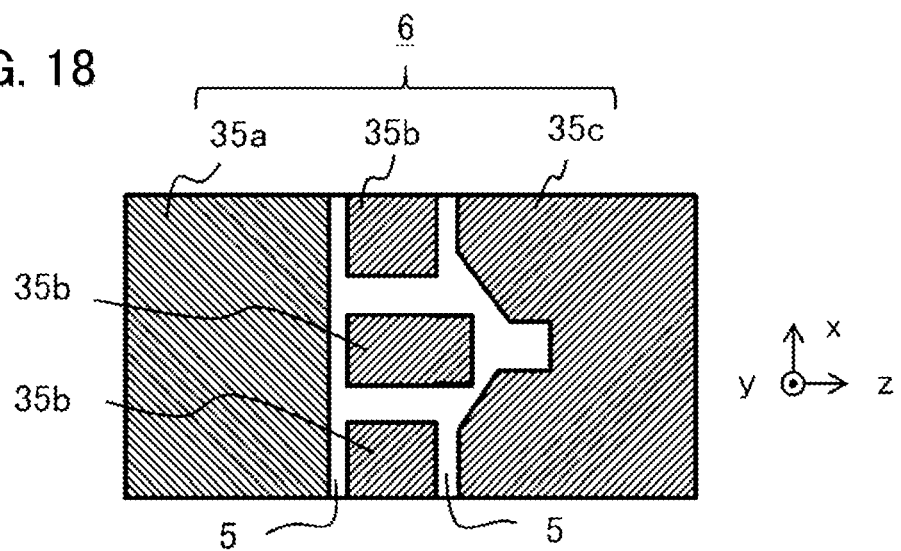
FIG. 18 is a diagram showing a p-type contact layer of the semiconductor laser device of FIG. 17.

FIG. 17 is a plan of a semiconductor laser device according to Embodiment 4, and FIG. 18 is a diagram showing a p-type contact layer of the semiconductor laser device of FIG. 17. The semiconductor laser device 100 of Embodiment 4 is different from the semiconductor laser device 100 of Embodiment 1 in that the semiconductor laser device 100 includes two enlarged parts 92, the main light receiving part 91 extends to the positive and negative side of the mesa stripe 18 in the x-direction, and the n-type contact layer 94 has a meandering outer edge shape, that is, an uneven outer edge shape. Differences from the semiconductor laser device 100 of Embodiment 1 will mainly be described.

In the photodetector 24 of Embodiment 4, since the regions of the main light receiving part 91 and the enlarged part 92 are wider than the corresponding regions of the main light receiving part 91 and the enlarged part 92 in the photodetector 24 of Embodiment 1, and since the n-type contact layer 94 has the meandering outer edge shape, that is, the uneven outer edge shape, the outer edge length of the n-type contact layer 94 of the photodetector 24 can be made longer than that of the photodetector 24 of Embodiment 1. In the semiconductor laser device 100 of Embodiment 4, since the outer edge length of the n-type contact layer 94 of the photodetector 24 is longer than that of the semiconductor laser device 100 of Embodiment 1, the ESD withstand voltage of the photodetector 24 can be made higher than that of the semiconductor laser device 100 of Embodiment 1. Since the semiconductor laser device 100 of Embodiment 4 has the same structure except for the difference described above, the same effects as those of the semiconductor laser device 100 of Embodiment 1 can be obtained.

Embodiment 5

Figure 19:
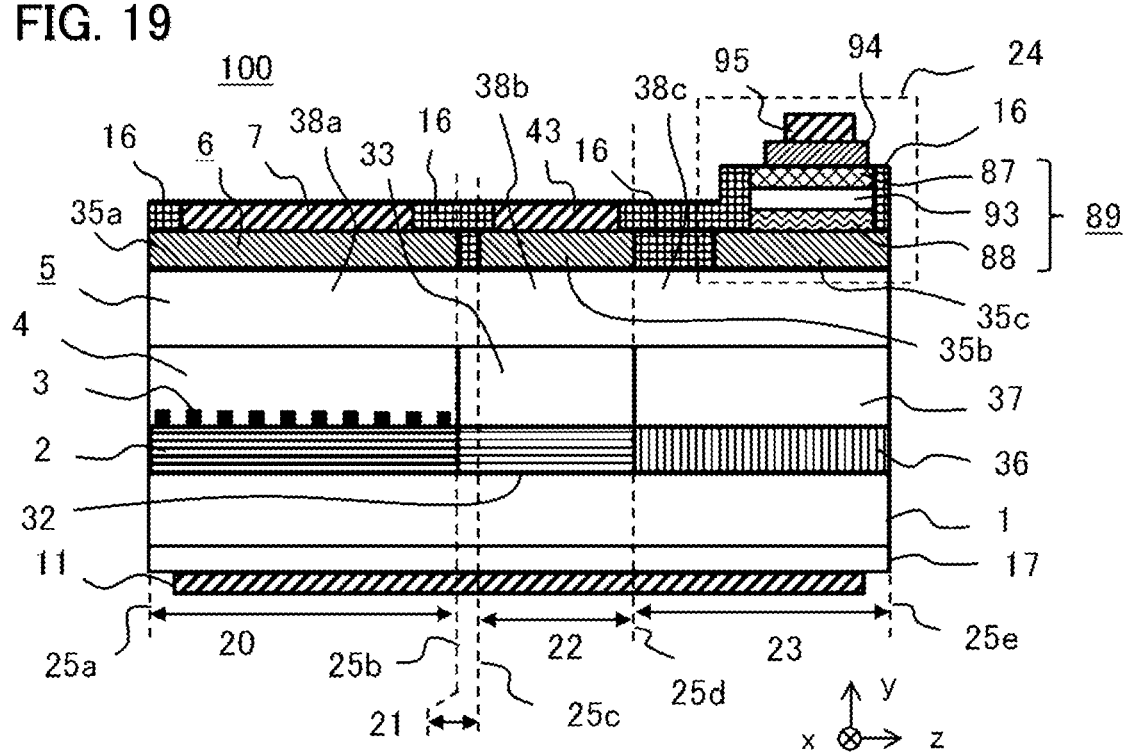
FIG. 19 is a cross-sectional view of a semiconductor laser device according to Embodiment 5.
Figure 20:
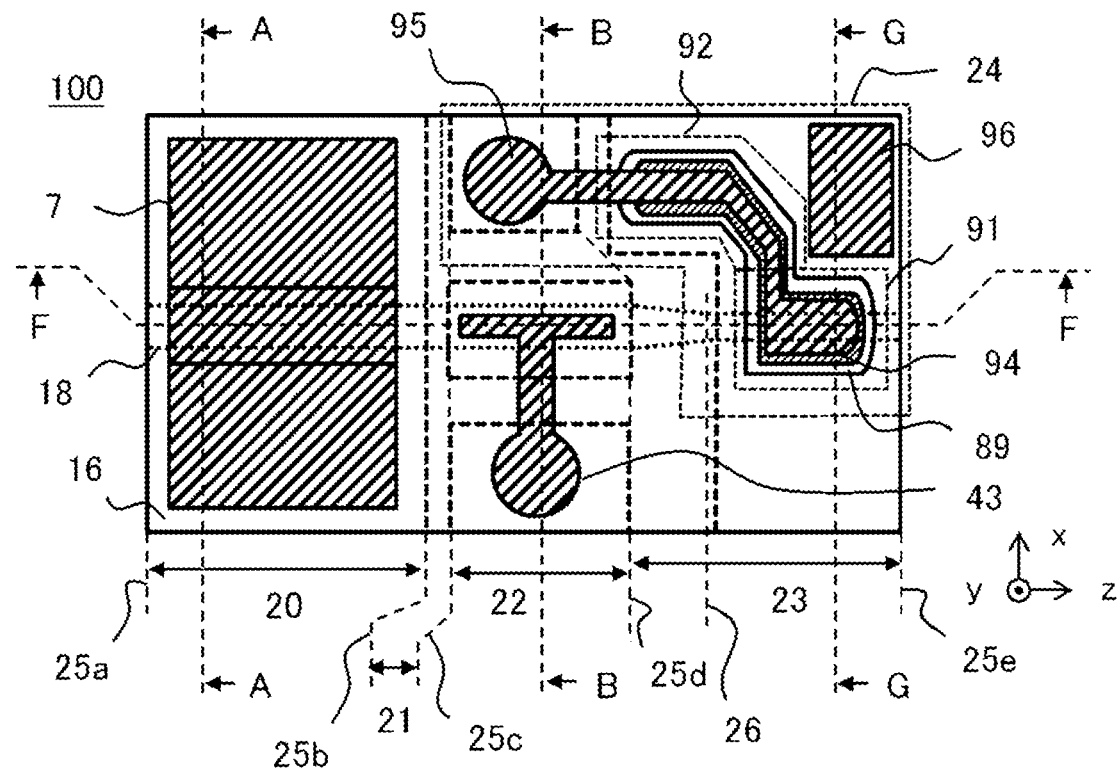
FIG. 20 is a plan view of the semiconductor laser device according to Embodiment 5.
Figure 21:
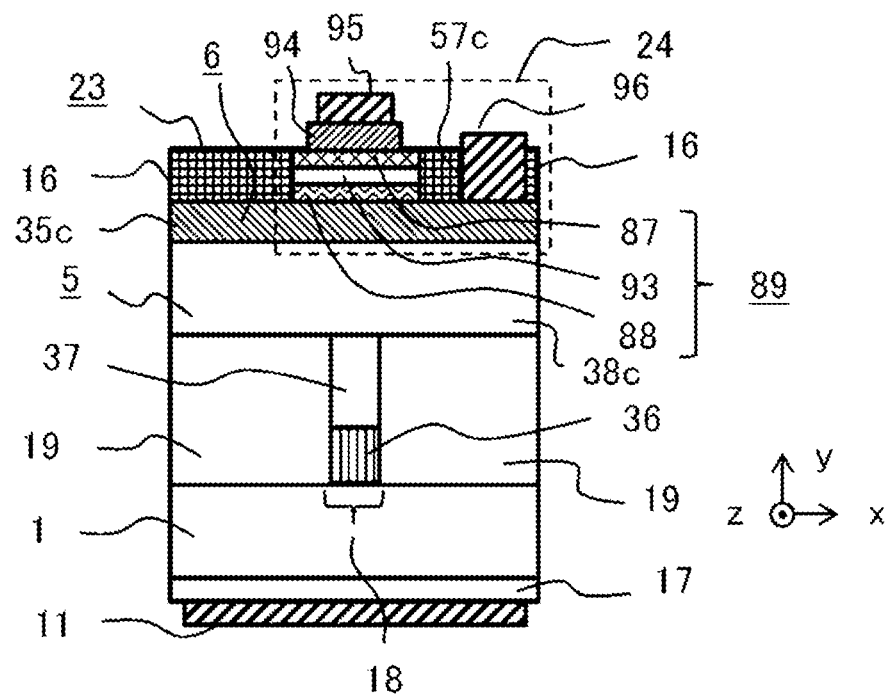
FIG. 21 is a cross-sectional view of a spot size converter part and a photodetector in the semiconductor laser device of FIG. 20.
Figure 22:
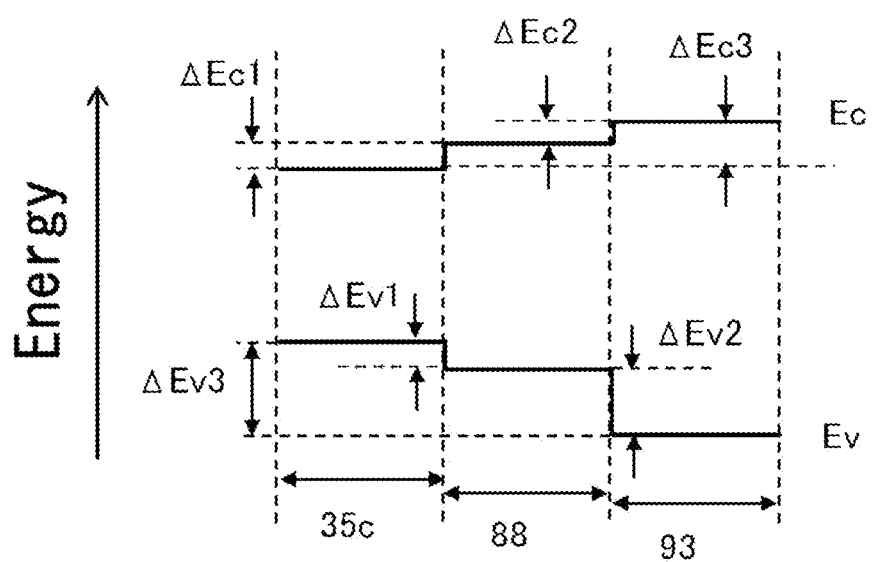
FIG. 22 is a band diagram of a first bandgap tuning layer of the photodetector according to Embodiment 5.
Figure 23:
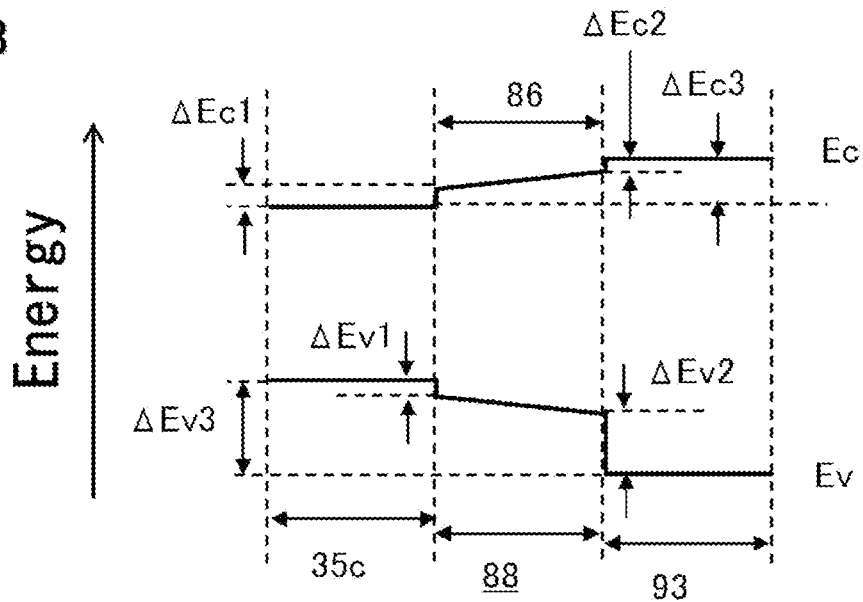
FIG. 23 is a band diagram of a second bandgap tuning layer of the photodetector according to Embodiment 5.

FIG. 19 is a cross-sectional view of a semiconductor laser device according to Embodiment 5, and FIG. 20 is a plan view of the semiconductor laser device according to Embodiment 5. FIG. 21 is a cross-sectional view of a spot size converter and a photodetector in the semiconductor laser device of FIG. 20. FIG. 22 is a band diagram of a first bandgap tuning layer of the photodetector according to Embodiment 5, and FIG. 23 is a band diagram of a second bandgap tuning layer of the photodetector according to Embodiment 5. The cross-sectional view of FIG. 19 is that taken along the dashed line F-F in FIG. 20. The cross-sectional view of FIG. 21 is that taken along the dashed line G-G in FIG. 20.

The semiconductor laser device 100 according to Embodiment 5 is different from the semiconductor laser device 100 according to Embodiment 1 in that an intermediate layer 89 between the p-type contact layer 35c and the n-type contact layer 94 in the photodetector 24 includes a band gap tuning layer 88 and an electric field relaxation layer 87. In the photodetector 24, the electric field relaxation layer 87 having an n-type impurity concentration lower than that of the n-type contact layer 94 is interposed between the undoped layer 93 and the n-type contact layer 94, and the band gap tuning layer 88 for gently tuning the change between the band gap of the p-type contact layer 35c and the band gap of the undoped layer 93 is interposed between the p-type contact layer 35c and the undoped layer 93. In FIG. 22 and FIG. 23, in addition to an energy band for the band gap tuning layer 88, those for the p-type contact layer 35c and the undoped layer 93 of undoped InP are also shown. Differences from the semiconductor laser device 100 of Embodiment 1 will mainly be described.

In the intermediate layer 89 between the p-type contact layer 35c and the n-type contact layer 94 in the photodetector 24, a plurality of semiconductor layers, that is, the band-gap tuning layer 88, the undoped layer 93 of undoped InP, and the electric field relaxation layer 87 of n-type InP, are sequentially stacked on the surface of the p-type contact layer 35c. The bandgap of the p-type contact layer 35c and the undoped layer 93 of undoped InP is 0.75 eV and 1.35 eV, respectively. As shown in FIG. 22 or FIG. 23, the bandgap tuning layer 88 is a layer for gently tuning the change between the bandgap of the p-type contact layer 35c and the bandgap of the undoped layer 93 of undoped InP. FIG. 22 shows an example of the bandgap tuning layer 88 having a bandgap wider than that of the p-type contact layer 35c and a bandgap narrower than that of the undoped layer 93. FIG. 23 shows an example of the bandgap tuning layer 88 in which the bandgap continuously widens from the p-type contact layer 35c toward the undoped layer 93.

In the bandgap tuning layer 88, the barrier height $\Delta Ec1$ of the conduction band and the barrier height $\Delta Ev1$ of the valence band with respect to the p-type contact layer 35c are smaller than the barrier height $\Delta Ec3$ of the conduction band and the barrier height $\Delta Ev3$ of the valence band between the p-type contact layer 35c and the undoped layer 93 of undoped InP, respectively. Similarly, in the bandgap tuning layer 88, the barrier height $\Delta Ec2$ of the conduction band and the barrier height $\Delta Ev2$ of the valence band with the undoped layer 93 of undoped InP are smaller than the barrier height $\Delta Ec3$ of the conduction band and the barrier height $\Delta Ev3$ of the valence band between the p-type contact layer 35c and the undoped layer 93 of undoped InP, respectively. Therefore, in the photodetector 24 of Embodiment 5, by interposing the bandgap tuning layer 88, the resistance between the p-type contact layer 35c and the undoped layer 93 of undoped InP can be made smaller than that of the photodetector 24 of Embodiment 1 having only the undoped layer 93 as an intermediate layer.

The electric field relaxation layer 87 of n-type is depleted when a voltage is applied to the photodetector 24 so that an electric field generated in the intermediate layer 89 can be suppressed, and it is a layer to which an n-type impurity of concentration lower than that of the n-type InGaAsP contact layer 94 is added. For example, the n-type impurity in the n-type InGaAsP contact layer 94 and the field relaxation layer 87 of n-type InP is sulfur (S). Typically, since the n-type InGaAsP contact layer 94 is usually doped with impurity on the order of $10^{18}$ to $10^{19}$ cm$^{-3}$, it is desirable that the electric field relaxation layer 87 of n-type InP be doped with impurity about $10^{17}$ cm$^{-3}$. Note that the n-type InGaAsP contact layer 94 in the other embodiments is, for example, sulfur.

In the photodetector 24 of Embodiment 5, since the bandgap tuning layer 88 is interposed between the p-type contact layer 35c and the undoped layer 93 of undoped InP, a voltage at which a photocurrent (monitor current) of the photodetector 24 rises is lower than that of the photodetector 24 of Embodiment 1, and the detection sensitivity of the photodetector 24 can be improved. Further, in the photodetector 24 of Embodiment 5, since the electric field relaxation layer 87 of n-type InP is interposed between the undoped layer 93 of undoped InP and the n-type InGaAsP contact layer 94, the electric field generated in the intermediate layer 89 is suppressed as compared with the photodetector 24 of Embodiment 1, the current amount of at the time of application of a high voltage can be suppressed, and the resistance to an applied high voltage can be enhanced. Since the photodetector 24 of Embodiment 5 has higher resistance to an applied high voltage than the photodetector 24 of Embodiment 1, the ESD withstand voltage can be made higher than that of the photodetector 24 of Embodiment 1.

In the semiconductor laser device 100 of Embodiment 5, similar to the semiconductor laser device 100 of Embodiment 1, since the outer edge length of the n-type contact layer 94 of the photodetector 24 is longer than that of the distributed feedback semiconductor laser with a monitor in Patent Document 1 in which only the main light receiving part 91 is provided in the photodetector 24, the ESD withstand voltage of the photodetector 24 can be made higher than that of the distributed feedback semiconductor laser with a monitor in Patent Document 1. Since the semiconductor laser device 100 of Embodiment 5 has the same structure as the semiconductor laser device 100 of Embodiment 1 except for the difference described above, the same effects as those of the semiconductor laser device 100 of Embodiment 1 can be obtained.

In the bandgap tuning layer 88 having the characteristic of the band diagram shown in FIG. 23, the bandgap can be continuously changed from the p-type contact layer 35c toward the undoped layer 93 of undoped InP by continuously changing the composition of the plurality of semiconductor layers. The band gap tuning layer 88 having the characteristic of the band diagram shown in FIG. 23 can be expressed as a graded layer 86 because the band gap continuously changes. That is, the bandgap tuning layer 88 having the characteristic of the band diagram shown in FIG. 23 is an example of the graded layer 86.

Embodiment 6

Figure 24:
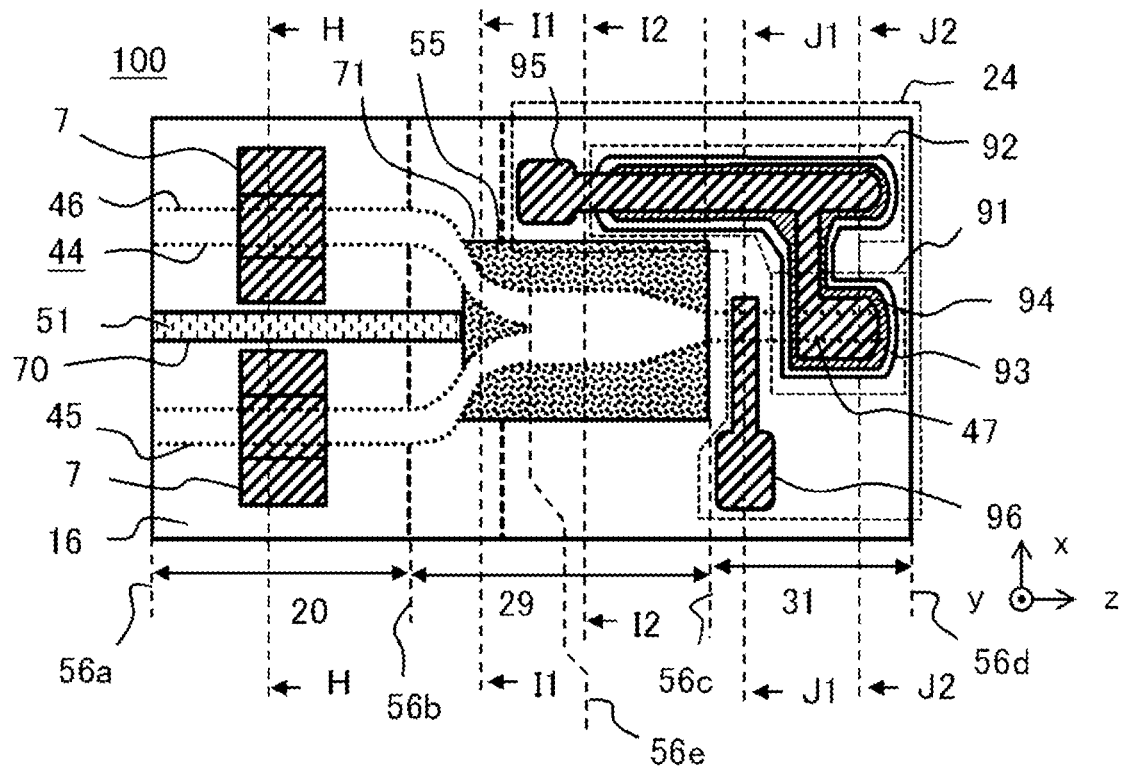
FIG. 24 is a plan view of a semiconductor laser device according to Embodiment 6.
Figure 25:
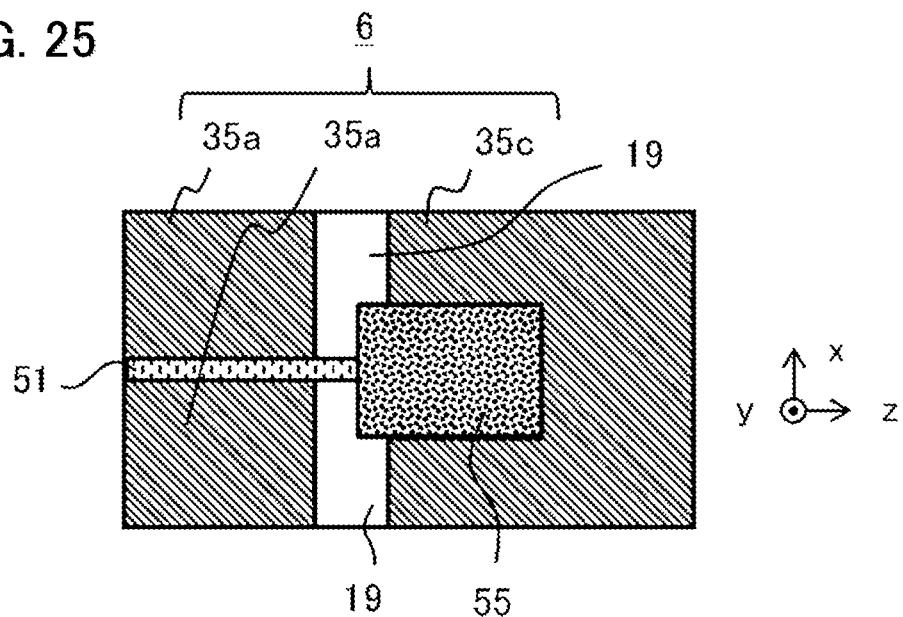
FIG. 25 is a diagram showing a p-type contact layer of the semiconductor laser device of FIG. 24.
Figure 26:
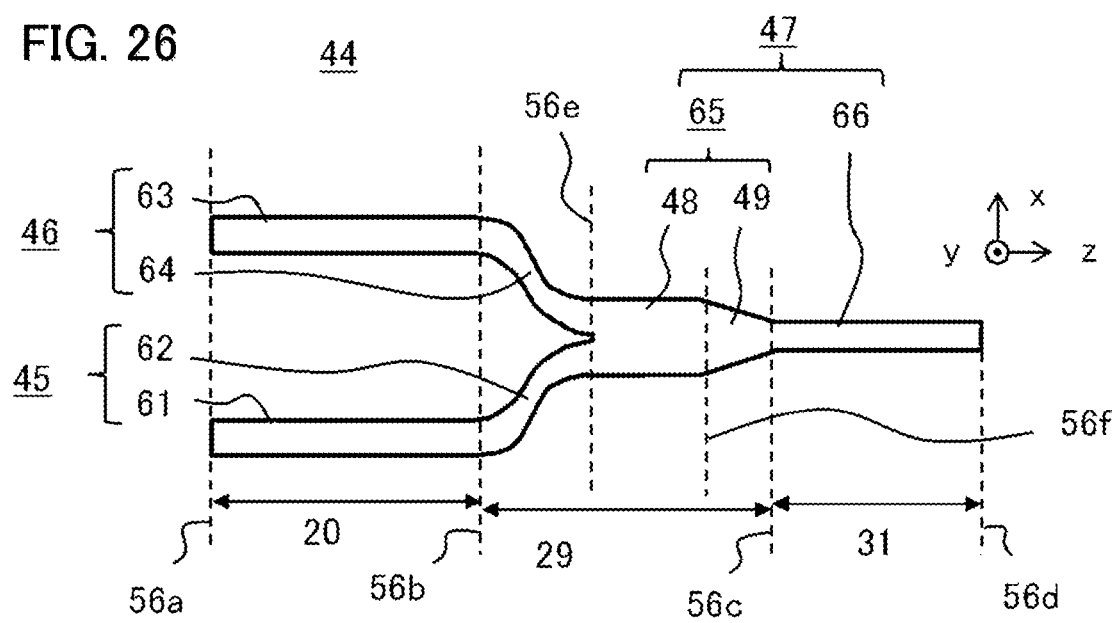
FIG. 26 is a diagram showing a first mesa structure in the semiconductor laser device of FIG. 24.
Figure 27:
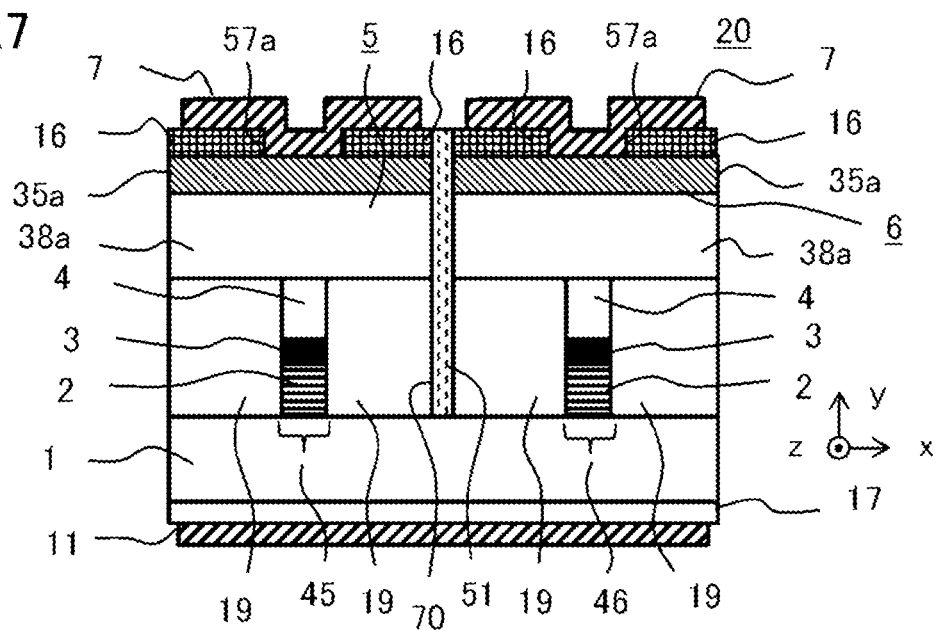
FIG. 27 is a cross-sectional view of a laser part in the semiconductor laser device of FIG. 24.
Figure 28:
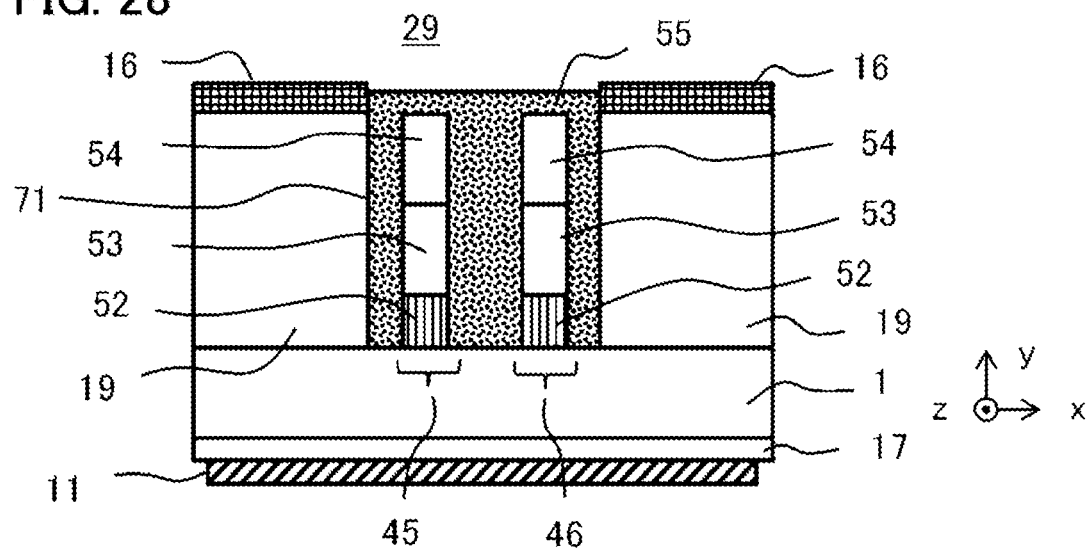
FIG. 28 is a cross-sectional view of an optical multiplexer part in the semiconductor laser device of FIG. 24.
Figure 29:
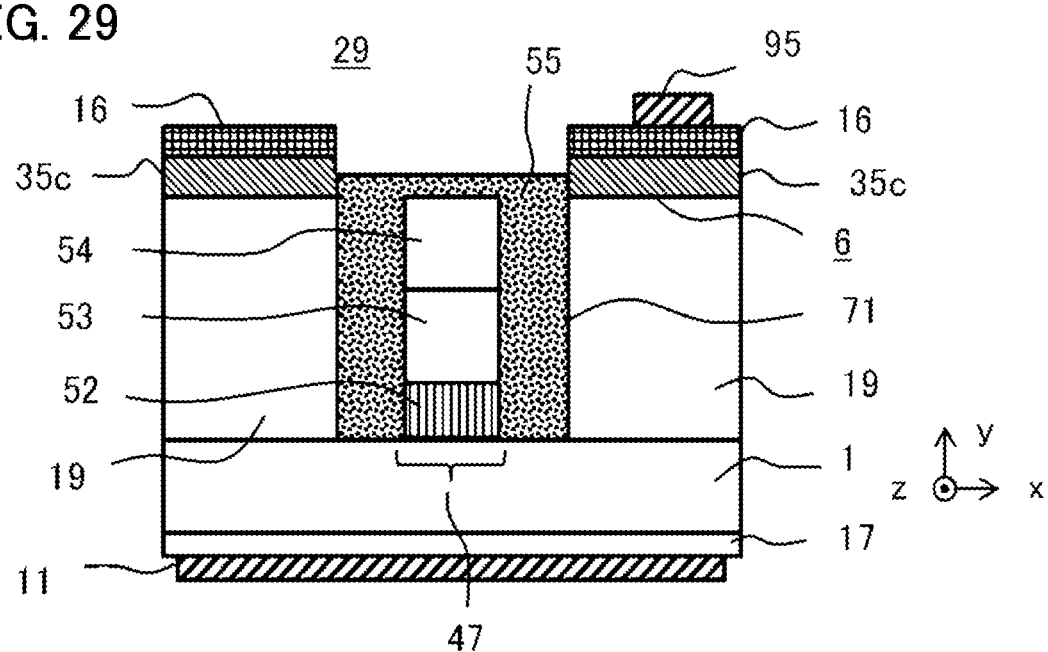
FIG. 29 is a cross-sectional view of the optical multiplexer part in the semiconductor laser device of FIG. 24.
Figure 30:
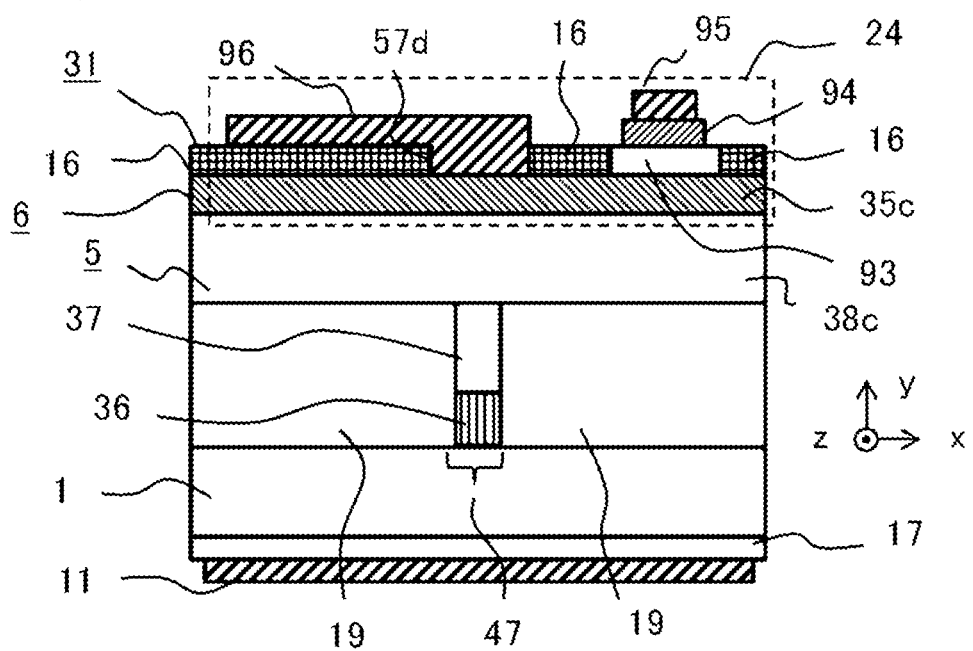
FIG. 30 is a cross-sectional view of a light emitting waveguide part and the photodetector in the semiconductor laser device of FIG. 24.
Figure 31:
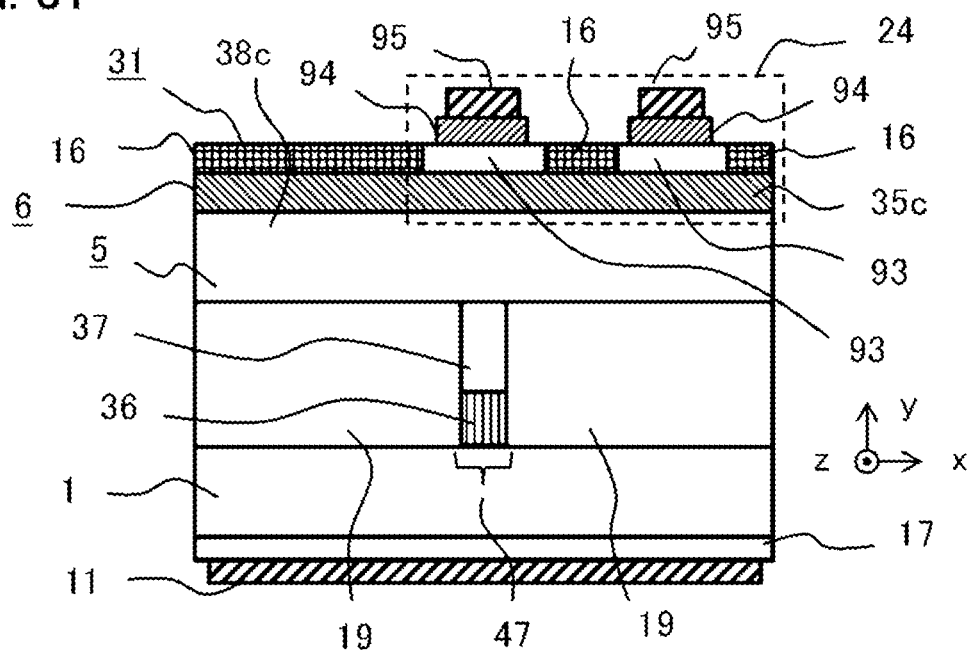
FIG. 31 is a cross-sectional view of the light emitting waveguide part and the photodetector in the semiconductor laser device of FIG. 24.
Figure 32:
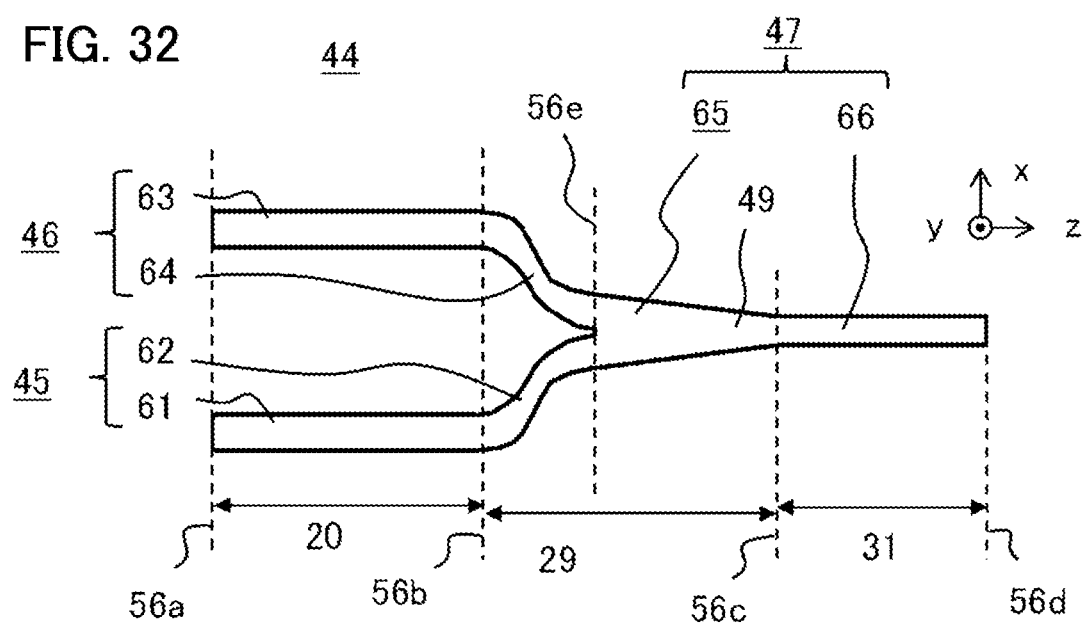
FIG. 32 is a diagram showing a second mesa structure in the semiconductor laser device of FIG. 24.

FIG. 24 is a plan view of a semiconductor laser device according to Embodiment 6. FIG. 25 is a diagram showing a p-type contact layer of the semiconductor laser device of FIG. 24, and FIG. 26 is a diagram showing a first mesa structure of the semiconductor laser device of FIG. 24. FIG. 27 is a cross-sectional view of the laser part in the semiconductor laser device of FIG. 24. FIG. 28 and FIG. 29 each are cross-sectional views of an optical multiplexer part in the semiconductor laser device of FIG. 24. FIG. 30 and FIG. 31 are cross-sectional views of a light emitting waveguide part and a photodetector in the semiconductor laser device of FIG. 24. FIG. 32 is a diagram showing a second mesa structure in the semiconductor laser device of FIG. 24. The cross-sectional views of FIG. 27 to FIG. 31 are those taken along the dashed lines indicated by H-H, I1-I1, I2-I2, J1-J1, and J2-J2 in FIG. 24, respectively.

The semiconductor laser device 100 according to Embodiment 6 differs from the semiconductor laser device 100 of Embodiment 1 in that two distributed feedback lasers are formed in the laser part 20, an optical multiplexer part 29 is provided instead of the separation part 21 and the modulator part 22, and the light emitting waveguide part 31 is provided instead of the spot size converter part 23. Note that the distributed feedback laser is simply referred to as a semiconductor laser, as appropriate. Differences from the semiconductor laser device 100 of Embodiment 1 will mainly be described.

The laser part 20 is formed in a region from a dashed line 56a to a dashed line 56b, the optical multiplexer part 29 is formed in a region from the dashed line 56b to a dashed line 56c, and the light emitting waveguide part 31 is formed in a region from the dashed line 56c to a dashed line 56d. The main light receiving part 91 of the photodetector 24 is formed on the front face side of the light emitting waveguide part 31, and the enlarged part 92 of the photodetector 24 is formed on the front face side of the light emitting waveguide part 31 and the optical multiplexer part 29. The anode electrode 96 of the photodetector 24, which is different from that of Embodiment 1, is disposed to extend in the x-direction so as to encompass a portion above a third mesa stripe 47 on the side to the optical multiplexer part 29 in the light emitting waveguide part 31. In the optical multiplexer part 29, a 2×1 multi-mode interference waveguide optical multiplexer (Multi-Mode Interference) for multiplexing the laser light output from each of the semiconductor lasers of the laser part 20 is formed. The multi-mode interference waveguide optical multiplexer is denoted by MMI as appropriate. In the laser part 20, for example, two distributed feedback lasers having different oscillation wavelengths are integrated, and the two distributed feedback lasers are separated by an insulating layer 51 of $SiO_2$ formed in a groove 70. Since the modulator part 22 is not formed in the semiconductor laser device 100 of Embodiment 6, the distributed feedback laser of the laser part 20 is a direct-modulation distributed feedback laser in which laser is directly modulated by an injection current injected from the anode electrode 7.

The optical multiplexer part 29 has the 2×1 MMI formed to multiplex two rays of modulated laser light, namely, rays of signal light, emitted from the laser part 20, and outputs it from one waveguide. The semiconductor laser device 100 of Embodiment 6 includes a mesa structure 44 in which the laser light emitted by the laser part 20 propagates. Two examples of the mesa structure 44 are shown in FIG. 26 and FIG. 32. In the first mesa structure 44 shown in FIG. 26, the laser part 20 includes a first waveguide 61 and a third waveguide 63, the optical multiplexer part 29 includes a second waveguide 62, a fourth waveguide 64, and a fifth waveguide 65, and the light emitting waveguide part 31 includes a sixth waveguide 66. The first waveguide 61 and the third waveguide 63 in the laser part 20 are in a region from the dashed line 56a to the dashed line 56b. The second waveguide 62 and the fourth waveguide 64 of the optical multiplexer part 29 are in a region from the dashed line 56b to a dashed line 56e, and the fifth waveguide 65 of the optical multiplexer part 29 is in a region from the dashed line 56e to the dashed line 56c. The sixth waveguide 66 of the light emitting waveguide part 31 is in a region from the dashed line 56c to the dashed line 56d. The second waveguide 62, the fourth waveguide 64, the fifth waveguide 65, and the sixth waveguide 66 are waveguides for propagating laser light emitted from the laser part 20. Between the laser part 20 and the light emitting waveguide part 31, the optical multiplexer part 29 is formed, which multiplexes the laser light emitted from a plurality of the semiconductor lasers to output it to the sixth waveguide 66.

The first mesa structure 44 shown in FIG. 26 includes a straight portion 48 in which the fifth waveguide 65 has a constant width in the x-direction and a tapered portion 49 in which the width of the x-direction gradually decreases in the z-direction. In the first mesa structure 44, the straight portion 48 is a region from the dashed line 56e to a dashed line 56f, and the tapered portion 49 is a region from the dashed line 56f to the dashed line 56c. The second mesa structure 44 shown in FIG. 32 is the same as the first mesa structure 44 except that the fifth waveguide 65 includes only the tapered portion 49. In the second mesa structure 44, the tapered portion 49 is a region from the dashed line 56e to the dashed line 56c. The mesa structure 44 is a combination of a plurality of mesa stripes. Here, an example is shown in which the mesa structure 44 includes three mesa stripes: a first mesa stripe 45, a second mesa stripe 46, and a third mesa stripe 47. The first mesa stripe 45 and the second mesa stripe 46 are in a region from the dashed line 56a to the dashed line 56e. The third mesa stripe 47 is in a region from the dashed line 56e to the dashed line 56d.

The two semiconductor lasers of the laser part 20, namely, a first semiconductor laser and a second semiconductor laser, emit laser light from the first waveguide 61 and the third waveguide 63, respectively. The first waveguide 61 and the third waveguide 63 are connected to the second waveguide 62 and the fourth waveguide 64 in the optical multiplexer part 29, respectively. The second waveguide 62 and the fourth waveguide 64 in the optical multiplexer part 29 are connected to the fifth waveguide 65. The fifth waveguide 65 of the optical multiplexer part 29 is connected to the sixth waveguide 66 of the light emitting waveguide part 31. In the optical multiplexer part 29, as shown in FIG. 24, FIG. 28, and FIG. 29, the fifth waveguide 65 and a part in the second waveguide 62 and the fourth waveguide 64 are surrounded by an organic insulating layer 55 formed in the groove 71. The organic insulating layer 55 is, for example, benzocyclobutene (BCB) 338. Note that, in FIG. 24, the mesa structure 44 in the organic insulating layer 55 is shown in white to make it easier to understand the mesa structure 44 embedded in the organic insulating layer 55.

The cross-sectional structures of the first semiconductor laser and the second semiconductor laser of the laser part 20 shown in FIG. 27 are the same as those of the laser part 20 shown in FIG. 4. The cross-sectional structures of the light emitting waveguide part 31 and the photodetector 24 shown in FIG. 30 and FIG. 31 are the same as that of the light emitting waveguide part 31 in the spot size converter part 23 of FIG. 6. Note that, in FIG. 31, the cross-sectional structures of the main light receiving part 91 and the enlarged part 92 connected to the main light receiving part 91 disposed above the third mesa stripe 47 are shown in association with the surface shape of the photodetector 24.

The cross-sectional structure of the optical multiplexer part 29 will be described. The optical multiplexer part 29 includes the semiconductor substrate 17, the first cladding layer 1 of n-type InP, a waveguide layer 52, a sixth cladding layer 53 of p-type InP, a seventh cladding layer 54 of p-type InP, the embedded layer 19 of InP, the contact layer 35c of p-type InGaAs, the insulating film 16, and the cathode electrode 11 formed on the rear surface of the semiconductor substrate 17. The third mesa stripe 47 of the optical multiplexer part 29 includes the waveguide layer 52 and the sixth cladding layer 53. The seventh cladding layer 54 is formed in a mesa shape on the surfaces of the first mesa stripe 45, the second mesa stripe 46 and the third mesa stripe 47. The side of the third mesa stripe 47 and the seventh cladding layer 54 and the surface of the seventh cladding layer 54 are embedded by the embedded layer 19. The waveguide layer 52 of the optical multiplexer part 29 is connected to the active layer 2 of the laser part 20 and the waveguide layer 36 of the light emitting waveguide part 31. Note that, in FIG. 29, the cathode electrode 95 of the photodetector 24 is also shown.

A method for manufacturing the semiconductor laser device 100 of Embodiment 6 will be described. The first cladding layer 1 is crystal-grown on the surface of the semiconductor substrate 17 by the MOCVD method. The active layer 2, the waveguide layer 52, and the waveguide layer 36 are formed for each of corresponding regions for the laser part 20, the optical multiplexer part 29, and the light emitting waveguide part 31 on the surface of a first cladding layer 1 by crystal growth using the MOCVD method and dry etching using an SiO$_2$ mask. The diffraction grating 3 is formed on the surface of the active layer 2 of the laser part 20 by crystal growth using the MOCVD method and dry etching using an SiO$_2$ mask. The second cladding layer 4, the sixth cladding layer 53, and the fourth cladding layer 37 are formed for each of corresponding surfaces for the diffraction grating 3, the waveguide layer 52, and the waveguide layer 36 by crystal growth using the MOCVD method and dry etching using an SiO$_2$ mask. An SiO$_2$ mask having the same shape as the surface shape of the mesa structure 44 is formed on the surfaces of the second cladding layer 4, the sixth cladding layer 53, and the fourth cladding layer 37, and the mesa structure 44 is formed by dry etching using the SiO$_2$ mask. Thereafter, the embedded layer 19 is crystal-grown on the exposed first cladding layer 1 on both sides of the mesa structure 44.

The SiO$_2$ mask is removed and the seventh cladding layer 54 is crystal-grown on the surfaces of the embedded layer 19 and the mesa structure 44. An SiO$_2$ mask for forming a mesa is formed on the seventh cladding layer 54 of the optical multiplexer part 29, and the seventh cladding layer 54 in the optical multiplexer part 29 at a portion where an opening of the SiO$_2$ mask is formed is removed by dry etching to expose the embedded layer 19. Thereafter, the embedded layer 19 is crystal-grown on the exposed surface of the embedded layer 19. The SiO$_2$ mask for forming the mesa of the seventh cladding layer 54 is removed, an SiO$_2$ mask is formed in the optical multiplexer 29, and the fifth cladding layer 5 is crystal-grown on the surfaces of the embedded layer 19 and the mesa structure 44 in the laser part 20 and the light emitting waveguide part 31. After the SiO$_2$ mask is removed, the contact layer 6 is crystal-grown on the surfaces of the fifth cladding layer 5, the seventh cladding layer 54 of the optical multiplexer part 29, and the embedded layer 19, and the contact layer 6 is patterned by wet etching using a photoresist mask.

After the photoresist mask is removed, the undoped layer 93 of the photodetector 24 is formed on the surface of the contact layer 6 by crystal growth using the MOCVD method and dry etching using an SiO$_2$ mask. The SiO$_2$ mask is removed, and the insulating film 16 is formed on the surface of the contact layer 6, the exposed fifth cladding layer 5, and the undoped layer 93. The insulating film 16 on the surface of the undoped layer 93 is removed by dry etching using a photoresist mask, and the contact layer 94 is formed on the exposed surface of the undoped layer 93 by crystal growth by the MOCVD and dry etching using an SiO$_2$ mask. The groove 70 is formed by dry etching using an SiO$_2$ mask for forming the groove 70 of the laser part 20, and the insulating layer 51 is formed in the groove 70. After the SiO$_2$ mask for the groove 70 is removed, the groove 71 is formed by dry etching using an SiO$_2$ mask for forming the groove 71 of the optical multiplexer part 29, and after the SiO$_2$ mask on the surface of the seventh cladding layer 54 of the optical multiplexer part 29 is removed, the organic insulating layer 55 is formed in the groove 71 such that the surface of the seventh cladding layer 54 is embedded. The SiO$_2$ mask is removed, and the openings 57a and 57d of the insulating film 16 for connecting the anode electrode 7 and the anode electrode 96 to the contact layer 6 are formed by wet etching using a photoresist mask. The photoresist mask is removed, a metal layer is formed on the front and rear surfaces of the semiconductor laser device 100, and the cathode electrode 11, the anode electrode 7, the cathode electrode 95, and the anode electrode 96 are formed.

The semiconductor laser device 100 of Embodiment 6 has a function of a wavelength variable light source by which signal light of a plurality of wavelengths can be output when two semiconductor lasers oscillate in a single mode in different wavelengths. In this case, laser light emitted from one semiconductor laser actually emitting light in the two semiconductor lasers oscillating in a single mode in different wavelengths is transmitted through the optical multiplexer part 29 and the light emitting waveguide part 31 to be emitted outside. The semiconductor laser device 100 of Embodiment 6 is a semiconductor laser device provided with a spare light source when two semiconductor lasers oscillate in a single mode in the same wavelength. In this case, typically, the first semiconductor laser is in operation, and when the first semiconductor laser fails, it is possible to prevent communication interruption due to the failure of the semiconductor laser by operating the second semiconductor laser.

In the photodetector 24 of Embodiment 6, since the region of the enlarged part 92 is wider than the region of the enlarged part 92 in the photodetector 24 of Embodiment 1, the outer edge length of the n-type contact layer 94 of the photodetector 24 can be made longer than that of the photodetector 24 of Embodiment 1. In the semiconductor laser device 100 of Embodiment 6, since the outer edge length of the n-type contact layer 94 of the photodetector 24 is longer than that of the semiconductor laser device 100 of Embodiment 1, the ESD withstand voltage of the photodetector 24 can be made higher than that of the semiconductor laser device 100 of Embodiment 1. Since the optical multiplexer part 29 includes the tapered portion 49, the optical multiplexer part 29 allows a spot size of a near-field pattern (NFP) in the laser light of the laser part 20 to be widened and a beam spread angle of a far-field pattern (FFP) to be narrowed, similar to the spot size converter part 23. Thus, a low-magnification lens can be used in an optical module product or an optical transceiver product using the semiconductor laser device 100 of Embodiment 6 provided with the optical multiplexer part 29 including the tapered portion 49.

Note that to the surface shape of the photodetector 24 of Embodiment 6 is applicable to the surface shapes of the photodetectors 24 of Embodiments 1 to 5. Since the anode electrode 96 is disposed above the mesa stripe 18, the end of the contact layer 35c on the modulator part 22 side in a portion crossing the mesa stripe 18 above the mesa stripe 18 (a portion encompassing the mesa stripe 18) in the spot size converter part 23 or the light emitting waveguide part 31 is brought close to the contact layer 35b of the modulator part 22. In a case where the surface shape of the photodetector 24 of Embodiment 6 is applied to the surface shapes of the photodetectors 24 of Embodiments 2 to 4, features different from those of Embodiment 1 are combined. In a case where the surface shape of the photodetector 24 of Embodiment 6 is applied to the surface shape of the photodetector 24 of Embodiment 2, the enlarged part 92 to be added is disposed so as to extend to the negative side of the mesa stripe 18 in the x-direction. In a case where the surface shape of the photodetector 24 of Embodiment 6 is applied to the surface shape of the photodetector 24 of Embodiment 3, the main light receiving part 91 is changed in shape and enlarged. In a case where the surface shape of the photodetector 24 of Embodiment 6 is applied to the surface shape of the photodetector 24 of Embodiment 4, the outer edge shape of the n-type contact layer 94 is made to meander to form an uneven surface.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

17: semiconductor substrate, 20: laser part, 22: modulator part, 23: spot size converter part, 24: photodetector, 27: tapered portion, 28: output waveguide part, 29: optical multiplexer part, 35c: contact layer, 86: graded layer, 87: electric field relaxation layer, 88: bandgap tuning layer, 91: main light receiving part, 92: enlarged part, 93: undoped layer, 94: contact layer, 95: cathode electrode, 96: anode electrode, 100: semiconductor laser device, L1, L2: length

The invention claimed is:

1. A semiconductor laser device comprising:
a laser part to emit laser light;
a waveguide to propagate the laser light emitted from the laser part; and
a photodetector to detect the laser light emitted from the laser part, wherein the laser part, the waveguide, and the photodetector are formed on a same semiconductor substrate;
the photodetector includes an anode electrode, a cathode electrode, a p-type contact layer which is formed above the waveguide on a side opposite to the semiconductor substrate and is connected to the anode electrode, an n-type contact layer connected to the cathode electrode, and an undoped layer formed between the p-type contact layer and the n-type contact layer; and
the undoped layer and the n-type contact layer in the photodetector include a main light receiving part disposed above the waveguide so as to encompass the waveguide, and an enlarged part disposed so as not to encompass the waveguide while connected to the main light receiving part.

2. The semiconductor laser device according to claim 1, wherein a spot size converter part to convert a beam spot diameter of the laser light is formed on the semiconductor substrate, and the waveguide is a waveguide of the spot size converter.

3. The semiconductor laser device according to claim 2, wherein the spot size converter part includes a tapered portion whose width in an x-direction is narrowed toward a propagation direction and an output waveguide part connected to a downstream side of the tapered portion in the propagation direction, the x-direction being a direction which is perpendicular to the propagation direction of the laser light to be incident and in which the semiconductor substrate extends, wherein the waveguide is the output waveguide part of the spot size converter part.

4. The semiconductor laser device according to claim 1, wherein the enlarged part is disposed on a positive side in an x-direction from the waveguide and on a negative side in the x-direction from the waveguide, the x-direction being the direction which is perpendicular to the propagation direction of the laser light and in which the semiconductor substrate extends.

5. The semiconductor laser device according to claim 1, wherein a length of the main light receiving part in an x-direction is longer than a length of a portion encompassing the waveguide in a z-direction being the propagation direction of the laser light, the x-direction being the direction which is perpendicular to the z-direction and in which the semiconductor substrate extends.

6. The semiconductor laser device according to claim 1, wherein the n-type contact layer of the main light receiving part has an uneven outer edge shape.

7. The semiconductor laser device according to claim 1, wherein, in the photodetector, an electric field relaxation layer having an n-type impurity concentration lower than that of the n-type contact layer is interposed between the undoped layer and the n-type contact layer.

8. The semiconductor laser device according to claim 1, wherein the photodetector includes a band gap tuning layer interposed between the p-type contact layer and the undoped layer, the band gap tuning layer being a layer to gently tune a change between a band gap of the p-type contact layer and a band gap of the undoped layer.

9. The semiconductor laser device according to claim 8, wherein the band gap tuning layer has a band gap wider than that of the p-type contact layer and narrower than that of the undoped layer.

10. The semiconductor laser device according to claim 8, wherein the band gap tuning layer is a graded layer in which a band gap continuously increases from the p-type contact layer toward the undoped layer.

11. The semiconductor laser device according to claim 1, wherein a modulator part to modulate the laser light is formed between the laser part and the waveguide.

12. The semiconductor laser device according to claim 1, wherein a plurality of semiconductor lasers are formed in the laser part, and an optical multiplexer part to multiplex laser light emitted from the plurality of semiconductor lasers and output the multiplexed laser light to the waveguide is formed between the laser part and the waveguide.

13. The semiconductor laser device according to claim 1, wherein the undoped layer is a layer of InP, and the n-type contact layer is a layer of n-type InGaAsP.

14. The semiconductor laser device according to claim 2, wherein the enlarged part is disposed on a positive side in an x-direction from the waveguide and on a negative side in the x-direction from the waveguide, the x-direction being the direction which is perpendicular to the propagation direction of the laser light and in which the semiconductor substrate extends.

15. The semiconductor laser device according to claim 3, wherein the enlarged part is disposed on a positive side in an x-direction from the waveguide and on a negative side in the x-direction from the waveguide, the x-direction being the direction which is perpendicular to the propagation direction of the laser light and in which the semiconductor substrate extends.

16. The semiconductor laser device according to claim 2, wherein a length of the main light receiving part in an x-direction is longer than a length of a portion encompassing the waveguide in a z-direction being the propagation direction of the laser light, the x-direction being the direction which is perpendicular to the z-direction and in which the semiconductor substrate extends.

17. The semiconductor laser device according to claim 3, wherein a length of the main light receiving part in an x-direction is longer than a length of a portion encompassing the waveguide in a z-direction being the propagation direction of the laser light, the x-direction being the direction which is perpendicular to the z-direction and in which the semiconductor substrate extends.

18. The semiconductor laser device according to claim 2, wherein the n-type contact layer of the main light receiving part has an uneven outer edge shape.

19. The semiconductor laser device according to claim 3, wherein the n-type contact layer of the main light receiving part has an uneven outer edge shape.

20. The semiconductor laser device according to claim 2, wherein, in the photodetector, an electric field relaxation layer having an n-type impurity concentration lower than that of the n-type contact layer is interposed between the undoped layer and the n-type contact layer.

* * * * *